(12) United States Patent
Nosaka

(10) Patent No.: US 12,531,535 B2
(45) Date of Patent: Jan. 20, 2026

(54) SWITCH DEVICE AND FRONT-END CIRCUIT

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 236 days.

(21) Appl. No.: 18/507,182

(22) Filed: Nov. 13, 2023

(65) Prior Publication Data

US 2024/0088861 A1 Mar. 14, 2024

Related U.S. Application Data

(63) Continuation of application No. PCT/JP2022/017924, filed on Apr. 15, 2022.

(30) Foreign Application Priority Data

May 14, 2021 (JP) ................... 2021-082817

(51) Int. Cl.
*H03H 7/38* (2006.01)
*H03K 17/693* (2006.01)
*H04B 1/40* (2015.01)

(52) U.S. Cl.
CPC ............. *H03H 7/38* (2013.01); *H03K 17/693* (2013.01); *H04B 1/40* (2013.01)

(58) Field of Classification Search
CPC .. H03K 17/693; H03K 17/687; H03K 17/102; H03K 17/04123; H03K 17/62;

(Continued)

(56) References Cited

U.S. PATENT DOCUMENTS 10,181,839 B2\* 1/2019 Tomita ..................... H03H 7/40
2007/0103252 A1\* 5/2007 Nakatsuka ................ H01P 1/15
333/103

FOREIGN PATENT DOCUMENTS

JP 2007-129571 A 5/2007
JP 2009-038500 A 2/2009

(Continued)

OTHER PUBLICATIONS

International Search Report and Written Opinion mailed on Jun. 14, 2022, received for PCT Application PCT/JP2022/017924, filed on Apr. 15, 2022, 11 pages including English Translation.

*Primary Examiner* — Lincoln D Donovan
*Assistant Examiner* — Tyler J Pereny
(74) *Attorney, Agent, or Firm* — XSENSUS LLP

(57) ABSTRACT

A switch device includes a common terminal, a switch circuit configured to switch between states of conduction between terminals, a switch circuit configured to switch between states of conduction between terminals, and a switch circuit configured to switch between states of conduction between at least one of terminals and a terminal. Switch elements are provided which are disposed on a path connecting the terminals, a path connecting the terminals, a path connecting the terminal and one of the terminals, and a path connecting the terminal and the other one of the terminals, respectively. The above switch element is formed of one or more stacked semiconductor elements, and the number of stacks of the semiconductor elements in the switch element is smaller than that in the switch element.

20 Claims, 24 Drawing Sheets

(58) Field of Classification Search
CPC ......... H03K 17/6872; H03K 2017/066; H03K 2217/0036; H03K 2217/0045; H03K 2217/0054; H03F 2200/451; H03F 2200/294; H03F 3/189; H03F 3/72; H03H 9/542; H03H 9/568; H03H 9/605; H03H 9/6403; H03H 9/6483; H03H 9/725; H03H 11/245; H03H 9/706; H04B 1/18; H04B 1/40; H04B 1/00; H04B 1/48
See application file for complete search history.

(56) References Cited

FOREIGN PATENT DOCUMENTS

| | | |
|---|---|---|
| JP | 2014-050098 A | 3/2014 |
| JP | 2014-150439 A | 8/2014 |
| WO | 2010/053131 A1 | 5/2010 |
| WO | 2014/109111 A1 | 7/2014 |

\* cited by examiner

Cp1=0.5pF (ideal)

Cp1=1.0pF (ideal)

Cp1=2.0pF (ideal)

SWITCH DEVICE AND FRONT-END CIRCUIT

CROSS-REFERENCE TO RELATED APPLICATIONS

This is a continuation application of PCT/JP2022/017924, filed on Apr. 15, 2022, designating the United States of America, which is based on and claims priority to Japanese Patent Application No. JP 2021-082817 filed on May 14, 2021. The entire contents of the above-identified applications, including the specifications, drawings and claims, are incorporated herein by reference in their entirety.

TECHNICAL FIELD

The present disclosure relates to switch devices, and, more particularly, to a switch device that can be used in a radio-frequency front-end circuit for communicating radio frequency signals in a plurality of communication bands.

BACKGROUND ART

In current years, communication terminals such as mobile communication devices are each required to be smaller and to support a plurality of communication bands.

To satisfy this requirement, for example, the radio-frequency module disclosed in Patent Document 1 includes a switch element and filters of a plurality of types. The switch element includes an antenna-side connection terminal connected to an antenna and a plurality of filter-side terminals connected to a filter side. The radio-frequency module can selectively perform communication in a plurality of communication bands in such a manner that the multiple filter-side terminals are selectively connected to the antenna-side terminal.

CITATION LIST

Patent Document

Patent Document 1: Japanese Unexamined Patent Application Publication No. 2014-050098

SUMMARY

Technical Problem

In the radio-frequency module disclosed in Patent Document 1, the number of terminals between which a switch circuit (switch element) can switch increases with the increase in the number of communication bands. In this case, a stray capacitance that is a capacitance generated between a common terminal of the switch circuit and the ground increases. Accordingly, a mismatch loss may increase when the number of communication bands increases.

To reduce such a mismatch loss, a configuration is considered in which switch circuits are connected to a plurality of stages (cascade connection). However, with this configuration, another problem arises that a signal loss due to a continuity resistance increases when the number of stages of switch circuits increases.

It is an object of the present disclosure to provide a switch device and a front-end circuit with which the reduction in a mismatch loss and the reduction in a signal loss due to a continuity resistance can be achieved.

Solution to Problem

A switch device according to the present disclosure includes a common terminal, a first switch circuit that includes a first terminal and a second terminal and is configured to switch between conduction and non-conduction between the first terminal and the second terminal, a second switch circuit that includes a third terminal and a fourth terminal and is configured to switch between conduction and non-conduction between the third terminal and the fourth terminal, and a third switch circuit that includes a fifth terminal and a plurality of sixth terminals and is configured to switch between conduction and non-conduction between the fifth terminal and at least one of the multiple sixth terminals. The first terminal and the third terminal are connected to the common terminal. The fifth terminal is connected to the fourth terminal. The first switch circuit, the second switch circuit, and the third switch circuit include respective first switch elements disposed on a first path connecting the first terminal and the second terminal, a second path connecting the third terminal and the fourth terminal, and a plurality of third paths each connecting the fifth terminal and corresponding one of the multiple sixth terminals, respectively. The first switch element includes one or more stacked semiconductor elements. The number of stacks of the one or more semiconductor elements in the first switch element in the second switch circuit is smaller than that in the first switch element in the first switch circuit.

Advantageous Effects

According to the present disclosure, the reduction in a mismatch loss and the reduction in a signal loss due to a continuity resistance can be achieved.

DESCRIPTION OF EMBODIMENTS

Figure 1:
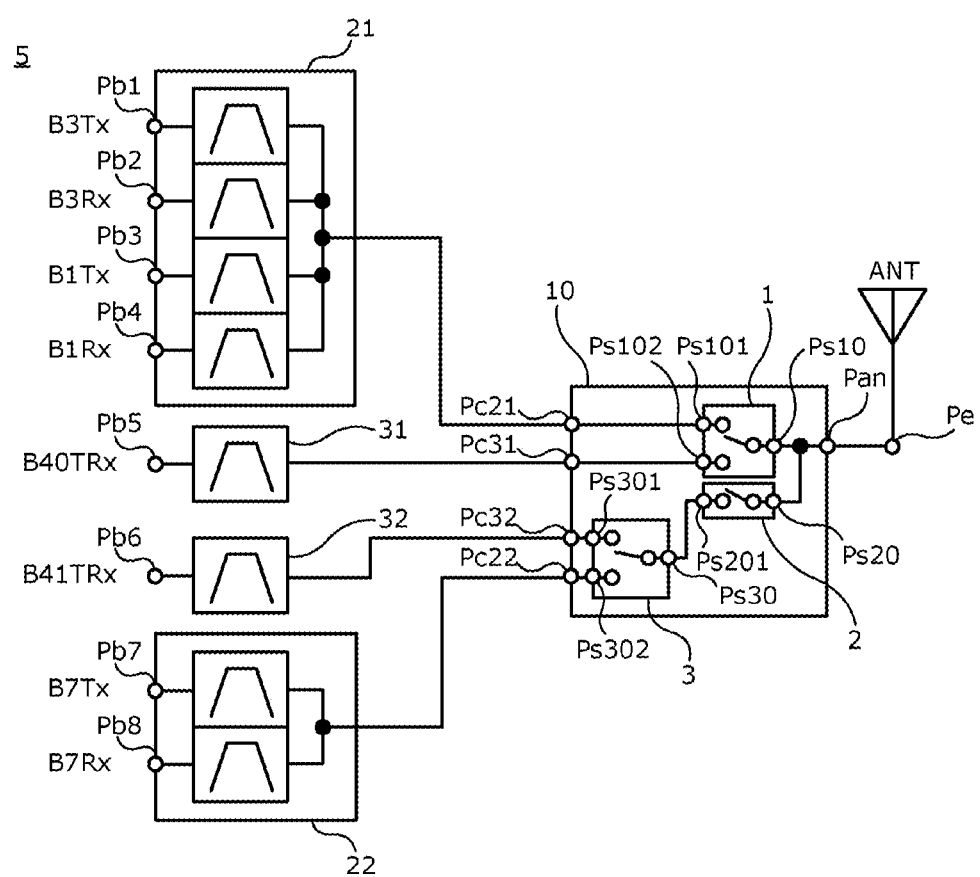
FIG. 1 is a circuit diagram of a radio-frequency front-end circuit according to a first embodiment.

Hereinafter, examples of embodiments of the present disclosure will be described. However, the following embodiments are merely examples. The present disclosure is not at all limited to the following embodiments.

In the drawings to be referred to in, for example, the embodiments, members having substantially the same function are referred to by the same reference symbols. The drawings to be referred to in, for example, the embodiments are schematically illustrated. A ratio of dimensions of objects drawn in the drawings may be different from a ratio of dimensions of actual objects. The ratio of the dimensions of the objects may differ between the drawings. For example, a specific ratio of dimensions of the objects needs to be determined in consideration of the following description.

First Embodiment

A radio-frequency front-end circuit including a switch device according to the first embodiment will be described with reference to drawings.

1. Configuration 1.1. Overall Configuration

FIG. 1 is a circuit diagram of a radio-frequency front-end circuit 5 including a switch device 10 according to the first embodiment. An antenna ANT is also illustrated in FIG. 1 as an example of a device to which the radio-frequency front-end circuit 5 is connected. A device to which the radio-frequency front-end circuit 5 is connected is not limited to an antenna and may be an amplifier, such as a PA (power amplifier) or an LNA (low noise amplifier).

The radio-frequency front-end circuit 5 is disposed between an RFIC (radio frequency integrated circuit, not illustrated) and the antenna ANT and transmits a radio frequency signal in a supporting communication band between the RFIC and the antenna ANT. In the present embodiment, the radio-frequency front-end circuit 5 supports Band3 (Tx: 1710 to 1785 MHz, Rx: 1805 to 1880 MHz), Band1 (Tx: 1920 to 1980 MHz, Rx: 2110 to 2170 MHz), Band40 (TRx: 2300 to 2400 MHz), Band41 (TRx: 2496 to 2690 MHz), and Band7 (Tx: 2500 to 2570 MHz, Rx: 2620 to 2690 MHz) in LTE (long term evolution). Here, "Tx" represents an uplink frequency in an FDD (frequency division duplex) communication band, "Rx" represents a downlink frequency in an FDD communication band, and "TRx" represents an uplink frequency and a downlink frequency in a TDD (time division duplex) communication band.

As illustrated in FIG. 1, the radio-frequency front-end circuit 5 includes a multiplexer 21 for Band3 and Band1, a multiplexer 22 for Band7, a filter 31 (first filter) for Band40 (first band), and a filter 32 (second filter) for Band41 (second filter).

A plurality of filters included in the multiplexers 21 and 22 and the filters 31 and 32 are, for example, acoustic wave filters that use SAWs (surface acoustic waves). These filters are not particularly limited and may be acoustic wave filters that use BAWs (bulk acoustic waves), LC resonant filters, or dielectric filters.

1.2. Schematic Configuration of Switch Device

The switch device 10 includes switch circuits 1 to 3 and switches a device connected to the antenna ANT among the multiplexers 21 and 22 and the filters 31 and 32.

Specifically, the switch device 10 includes a common terminal Pan connected to the antenna ANT via an external terminal Pe of the radio-frequency front-end circuit 5, a terminal Pc21 connected to terminals Pb1 to Pb4 of the radio-frequency front-end circuit 5 via the multiplexer 21, a terminal Pc22 connected to terminals Pb7 and Pb8 of the radio-frequency front-end circuit 5 via the multiplexer 22, a terminal Pc31 connected to a terminal Pb5 of the radio-frequency front-end circuit 5 via the filter 31, and a terminal Pc32 connected to a terminal Pb6 of the radio-frequency front-end circuit 5 via the filter 32.

The switch circuit 1 is an example of a first switch circuit, is a so-called SPnT (n=2 in the present embodiment) switch including a plurality of switch elements, and has a terminal Ps10 (first terminal), a terminal Ps101 (second terminal), and a terminal Ps102. The terminals Ps10, Ps101, and Ps102 are connected to the common terminal Pan of the switch device 10, the terminal Pc21 of the switch device 10, and the terminal Pc31 of the switch device 10, respectively. The switch circuit 1 selectively conducts at least one of the terminal Ps101 or Ps102 to the terminal Ps10. Alternatively, the switch circuit 1 conducts neither the terminal Ps101 or Ps102 to the terminal Ps10.

The switch circuit 2 is an example of a second switch circuit, is a so-called SPST switch including one or more switch elements, and has a terminal Ps20 (third terminal) and a terminal Ps201 (fourth terminal). The terminals Ps20 and Ps201 are connected to the common terminal Pan of the switch device 10 and a terminal Ps30 of the switch circuit 3 to be described below, respectively. The switch circuit 2 conducts or does not conduct the terminal Ps201 to the terminal Ps20.

The switch circuit 3 is an example of a third switch circuit, is a so-called SPnT (n=2 in the present embodiment) switch including a plurality of switch elements, and has the terminal Ps30 (fifth terminal), a terminal Ps301 (sixth terminal), and a terminal Ps302 (sixth terminal). The terminals Ps30, Ps301, and Ps302 are connected to the terminal Ps201 of the switch circuit 2, the terminal Pc32 of the switch device 10, and the terminal Pc22 of the switch device 10, respectively. The switch circuit 3 selectively conducts at least one of the terminal Ps301 or Ps302 to the terminal Ps30. Alternatively, the switch circuit 3 conducts neither the terminal Ps301 or Ps302 to the terminal Ps30.

The switch circuit 3 is connected to the common terminal Pan via the switch circuit 2. That is, the switch device 10 has a cascade-connection configuration in which the switch circuits 2 and 3 are provided in multiple stages. The switch device 10 can therefore reduce a stray capacitance that is a capacitance generated between the common terminal Pan and the ground and can consequently reduce a mismatch loss. This will be described below with reference to a first comparative example.

Each of the switch circuits 1 to 3 includes one or more stacked semiconductor elements, which will be described in detail below. In the switch device 10, the number of stacks of semiconductor elements connected between the terminals Ps20 and Ps201 in the switch circuit 2 is lower than the number of stacks of semiconductor elements connected between the terminals Ps10 and Ps101 in the switch circuit 1. The switch device 10 can therefore reduce not only a mismatch loss but also a signal loss due to a continuity resistance. This will be described in detail below with reference to a second comparative example.

The switch device 10 having this configuration switches a device connected to the antenna ANT by switching between conduction and non-conduction between the common terminal Pan and each of the terminals Pc21, Pc22, Pc31, and Pc32 in accordance with a control signal from a control unit (not illustrated) in or outside the radio-frequency front-end circuit 5.

1.3. Detailed Configuration of Switch Device

Figure 2:
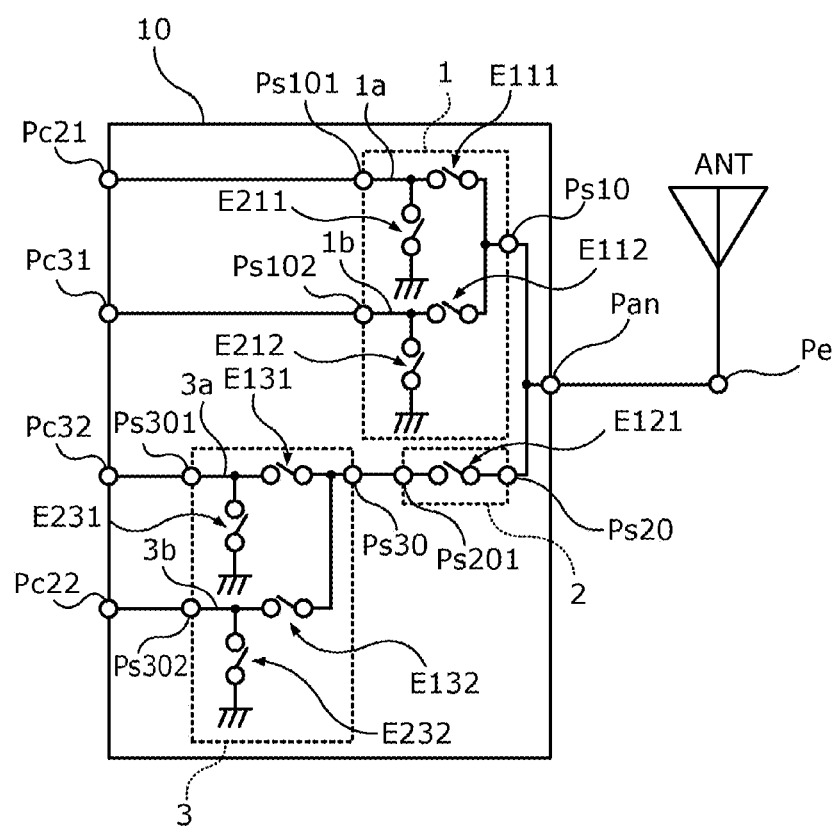
FIG. 2 is a circuit diagram of a switch device according to the first embodiment.

The detailed configuration of the switch device 10 will be described below focusing on switch elements included in the switch circuits 1 to 3. FIG. 2 is a detailed circuit diagram of the switch device 10 according to the first embodiment.

The switch circuit 1 includes a switch element E111 connected between the terminals Ps10 and Ps101 and a switch element E112 connected between the terminals Ps10 and Ps102 and selectively conducts at least one of the terminal Ps101 or Ps102 to the terminal Ps10 by switching between conduction and non-conduction of the switch elements E111 and E112 in accordance with a control signal. The switch element E111 is disposed on a path 1a (first path) connecting the terminals Ps10 and Ps101. The switch element E112 is disposed on a path 1b connecting the terminals Ps10 and Ps102. The switch circuit 1 further includes a switch element E211 connected between the path 1a and the ground and a switch element E212 connected between the path 1b and the ground. The switch element E211 is disposed between the switch element E111 and the terminal Ps101. The switch element E212 is disposed between the switch element E112 and the terminal Ps102.

The switch circuit 2 includes a switch element E121 connected between the terminals Ps20 an Ps201 and switches between conduction and non-conduction between the terminals Ps201 and Ps30 by switching between conduction and non-conduction of the switch element E121 in accordance with a control signal. The switch element E121 is disposed on a second path connecting the terminals Ps20 and Ps201.

The switch circuit 3 includes a switch element E131 connected between the terminals Ps30 and Ps301 and a switch element E132 connected between the terminals Ps30 and Ps302 and selectively conducts at least one of the terminal Ps301 or Ps302 to the terminal Ps30 by switching between conduction and non-conduction of the switch elements E131 and E132 in accordance with a control signal. The switch element E131 is disposed on a path 3a (third path) connecting the terminals Ps30 and Ps301. The switch element E132 is disposed on a path 3b (third path) connecting the terminals Ps30 and Ps302. The switch circuit 3 further includes a switch element E231 connected between the path 3a and the ground and a switch element E232 connected between the path 3b and the ground. The switch element E231 is disposed between the switch element E131 and the terminal Ps301. The switch element E232 is disposed between the switch element E132 and the terminal Ps302.

The switch elements E211, E212, E231, and E232 are examples of a second semiconductor element.

Thus, in the switch circuits 1 and 3, not only the switch elements E111, E112, E131, and E132 that are disposed on the communication paths connecting the common terminal Pan and the terminals Pc21, Pc31, Pc32, and Pc22, respectively but also the switch elements E211, E212, E231, and E232 disposed on the paths connecting the ground and the paths are provided. The switch elements E211, E212, E231, and E232 are brought into a non-conduction state when the switch elements E111, E112, E131, and E132 are in a conduction state, respectively, and are brought into the conduction state when the switch elements E111, E112, E131, and E132 are in the non-conduction state, respectively. That is, the switch elements E211 and E111, the switch elements E212 and E112, the switch elements E231 and E131, and the switch elements E232 and E132 exclusively operate. In the present embodiment, the switch elements E131 and E132 included in the switch circuit 3 are also brought into the non-conduction state when the switch element E121 is in the non-conduction state for ensuring the pressure resistance of the switch element E121.

Figure 3:
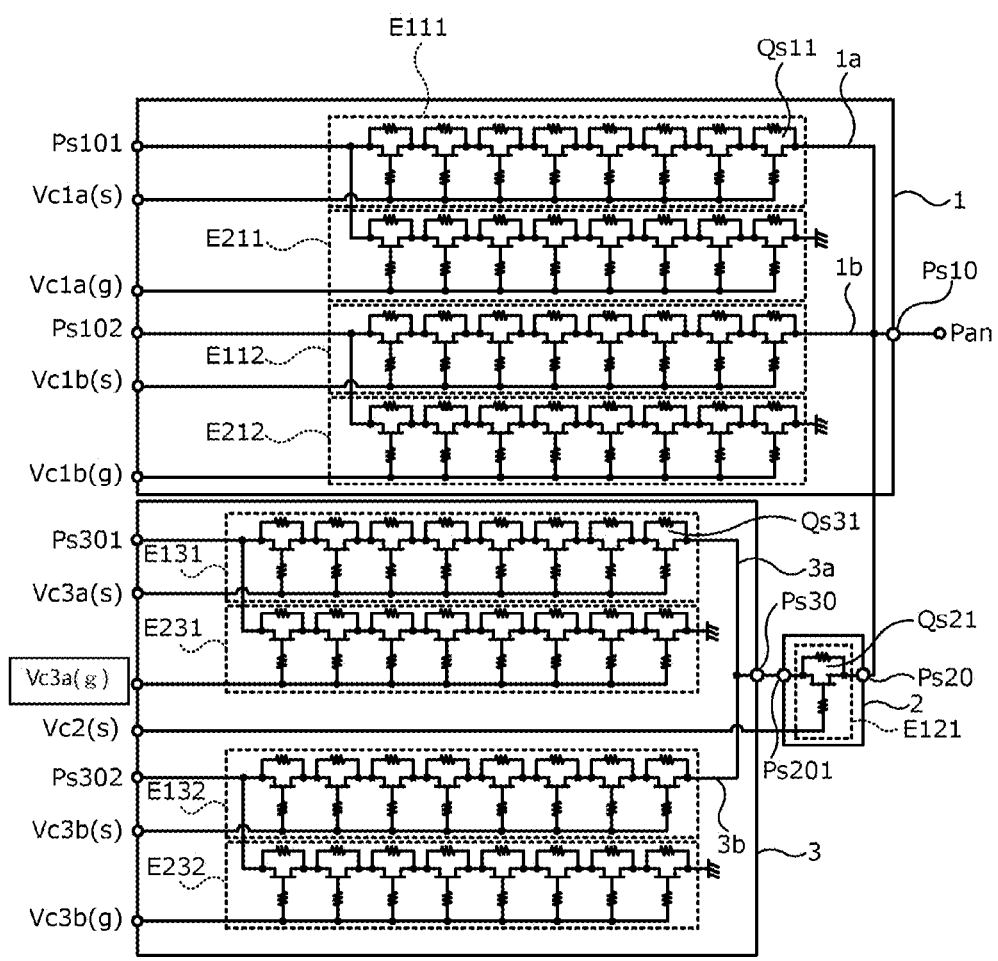
FIG. 3 is a circuit diagram illustrating a switch device according to the first embodiment using semiconductor elements.

FIG. 3 is a circuit diagram illustrating the switch device 10 using semiconductor elements. As illustrated in this drawing, each of the switch elements E111, E211, E112, E212, E121, E131, E231, E132, and E232 includes one or more stacked semiconductor elements. A semiconductor element is an FET (field effect transistor) in the present embodiment, but is not limited thereto. A semiconductor element may be, for example, a diode switch or an MEMS switch. Of the switch elements E111, E211, E112, E212, E121, E131, E231, E132, and E232, only the switch element E121 includes a single FET and each of the other switch elements includes a plurality of FETs (e.g., eight FETs) in the present embodiment.

In the switch elements E111, E211, E112, E212, E121, E131, E231, E132, and E232, the gates of FETs are connected to corresponding control terminals Vc1a(s), Vc1a(g), Vc2(s), Vc3a(s), Vc3a(g), Vc3b(s), Vc3b(g). In the switch elements E111, E211, E112, E212, E131, E231, E132, and E232 each including a plurality of FETs, the source of one of two adjacent FETs and the drain of the other one of the two adjacent FETs are connected.

The number of stacks of semiconductor elements included in a switch element is determined in accordance with the pressure resistance (withstand voltage) of a semiconductor element and a voltage applied to the switch element. For example, when the pressure resistance of a semiconductor element is 2.5 V and a voltage applied to a switch element is 20 V, eight or more stacks of semiconductor elements are needed. This will be described below with specific examples.

It is assumed that the voltage of 20 V is applied between the common terminal Pan of the switch device 10 and the ground when the switch device 10 transmits a radio frequency signal. At that time, the switch elements E111 and E112 included in the switch circuit 1 are required to have the pressure resistance of 20 V, but the switch element E121 included in the switch circuit 2 is required to have only the pressure resistance of a smaller voltage.

Specifically, since the switch element E121 is brought into the non-conduction state when at least one of the switch element E111 or E112 included in the switch circuit 1 is in the conduction state, a voltage applied to the switch element E121 at that time is the highest. Since the switch elements E131 and E132 included in the switch circuit 3 are also in the non-conduction state when the switch element E121 in the non-conduction state in the present embodiment, the voltage of 20 V applied between the common terminal Pan of the switch device 10 and the ground is not applied to only the switch element E121 and is divided by the switch element E121 and the switch elements E131 and E132.

Accordingly, even if the number of stacks of FETs included in the switch element E121 in the switch circuit 2 is smaller than the number of stacks of FETs included in the switch elements E111 and E112 in switch circuit 1, the pressure resistance of the switch element E121 can be ensured and the switch device 10 can be prevented from being broken as a result.

2. Comparison with First and Second Comparative Examples

The configuration of the switch device 10 according to the present embodiment has been described above. The main effects produced by the switch device 10 will be described below using the first and second comparative examples.

First, a point that, by reducing the stray capacitance of the switch device 10 according to the first embodiment, a mismatch loss can be reduced as a result will be described with reference to the first comparative example.

Figure 4:
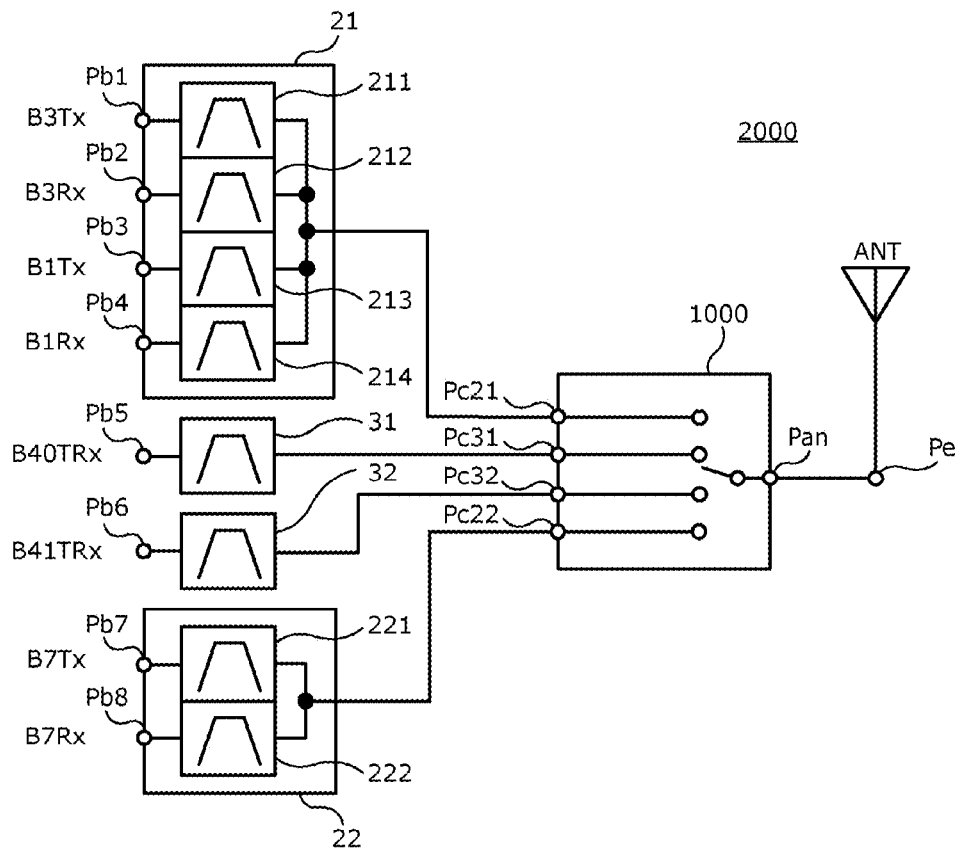
FIG. 4 is a circuit diagram of a switch device according to a first comparative example.

FIG. 4 is a circuit diagram of a radio-frequency front-end circuit 2000 including a switch device 1000 according to the first comparative example. As illustrated in FIG. 4, the radio-frequency front-end circuit 2000 differs from the radio-frequency front-end circuit 5 according to the first embodiment in that it includes the SP4T-type switch device 1000 instead of the switch device 10. Specifically, the two switch elements are disposed on a path connecting the common terminal Pan to terminals Pc22 and Pc32 in the switch device 10 according to the first embodiment, but only a single switch element is deposed on the path in the first comparative example.

In an SPnT-type switch device, a stray capacitance that is a capacitance generated between a common terminal and the ground generally increases with the increasing number of to-be-selected terminals under the influence of the off capacitance of a switch element included in the switch device. A "to-be-selected terminal" represents a terminal to be selectively connected to a common terminal in a switch circuit. An "off capacitance" of a switch element represents a capacitance when the switch element is in the non-conduction state.

Figure 5A:
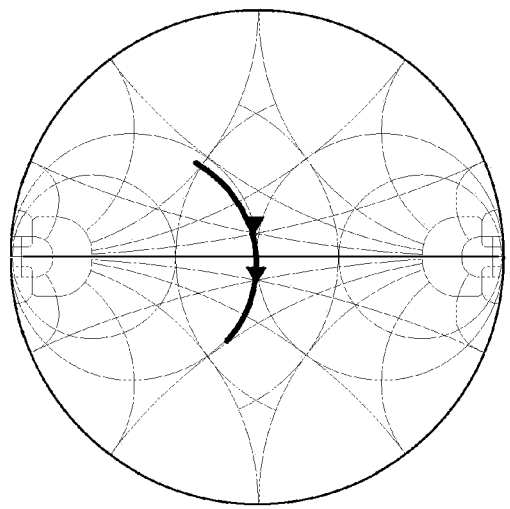
FIG. 5A is a first Smith chart representing an impedance in the first embodiment.
Figure 5B:
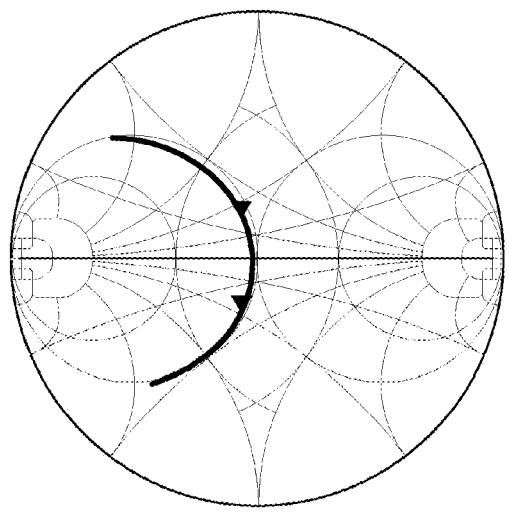
FIG. 5B is a second Smith chart representing an impedance in the first embodiment.
Figure 5C:
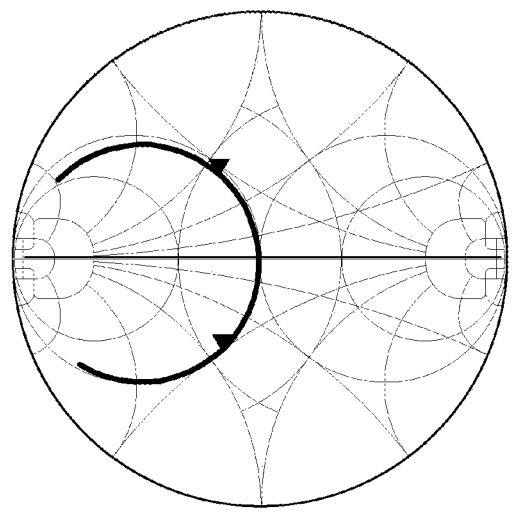
FIG. 5C is a third Smith chart representing an impedance in the first embodiment.
Figure 5D:
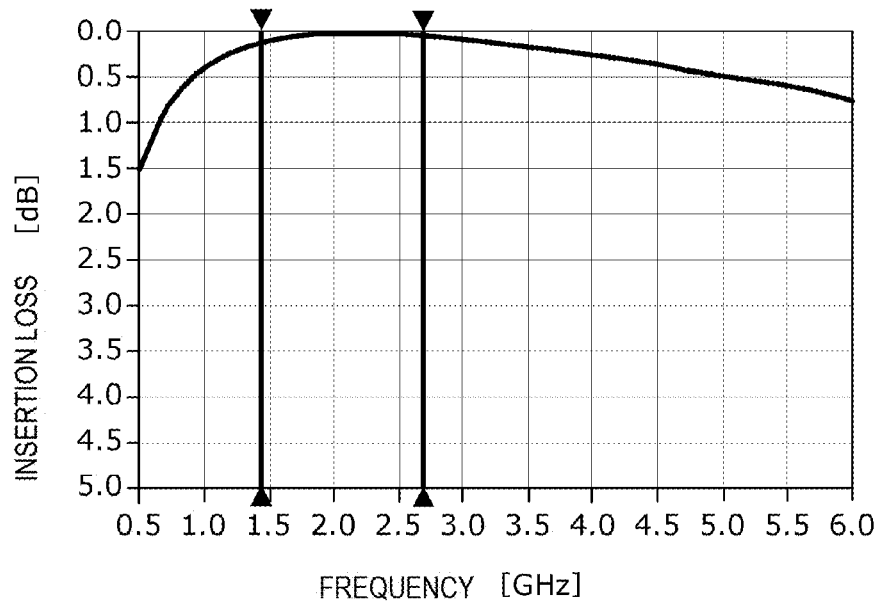
FIG. 5D is a first graph representing an insertion loss of a switch device according to the first embodiment.
Figure 5E:
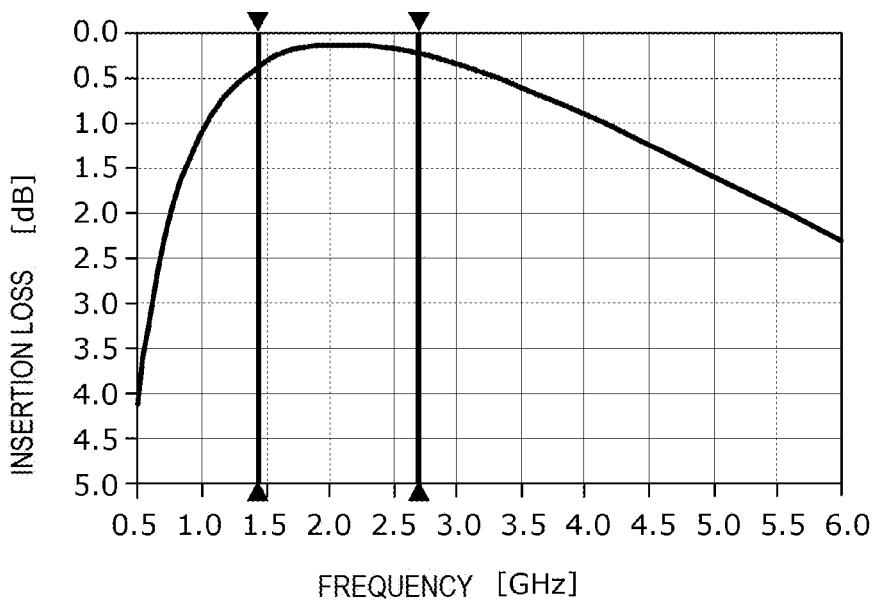
FIG. 5E is a second graph representing an insertion loss of a switch device according to the first embodiment.
Figure 5F:
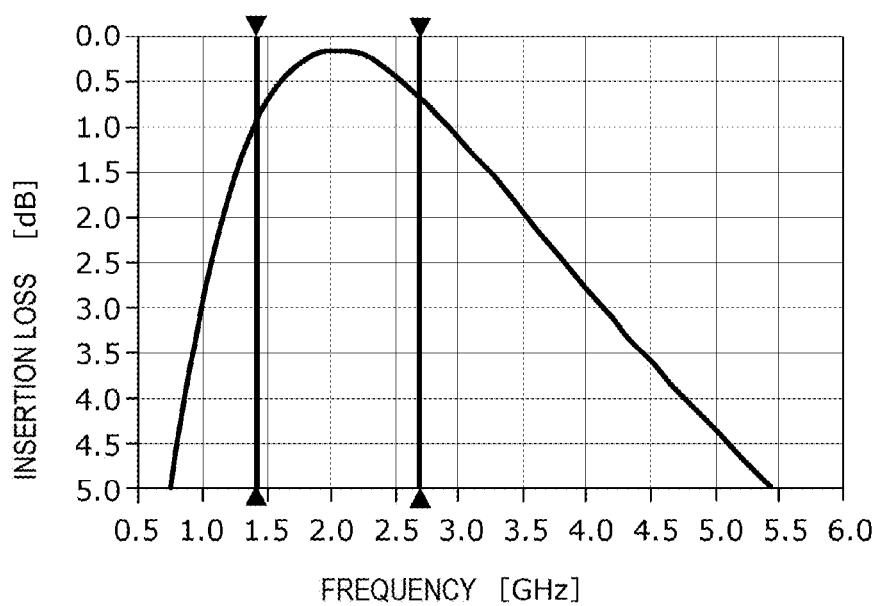
FIG. 5F is a third graph representing an insertion loss of a switch device according to the first embodiment.

In a radio-frequency front-end circuit including a switch device, the stray capacitance of the switch device affects a mismatch loss. FIGS. 5A to 5C and 5D to 5F are graphs for describing the relationship between a stray capacitance and a loss. Specifically, FIGS. 5A to 5C are Smith charts representing the impedances of a common terminal of a switch device when a stray capacitance Cp1 of the switch device is 0.5, 1.0, and 2.0 [pF], respectively. FIG. 5D to 5F are graphs representing insertion losses of a switch device when the stray capacitance Cp1 of the switch device is 0.5, 1.0, and 2.0 [pF], respectively.

As illustrated in FIGS. 5A to 5C and 5D to 5F, an impedance deviation increases with the increase in the stray capacitance Cp1 and a mismatch loss that is an insertion loss due to an impedance mismatch increases as a result.

In the switch device 10 according to the first embodiment, a stray capacitance is suppressed by cascade-connecting the switch circuits 2 and 3 to reduce a mismatch loss.

In a switch element included in a switch device, a capacitance that is a parasitic component called an off capacitance is generally generated in the non-conduction state. Accordingly, in the case where only optional one of to-be-selected terminals is connected to a common terminal, the total of off capacitances of respective switch elements connected between the common terminal and the remaining to-be-selected terminals affect a stray capacitance in a switch device in which switch circuits are not cascade-connected. In contrast, in a switch device in which switch circuits are cascade-connected, a composite capacitance smaller than the total of off capacitances of respective switch elements affects a stray capacitance because switch elements are connected in series to each other.

Accordingly, in the switch device 10 according to the first embodiment, a stray capacitance can be reduced as compared with in the switch device 1000 according to the first comparative example.

Next, a point that the switch device 10 according to the first embodiment can also reduce a signal loss due to a continuity resistance while reducing a mismatch loss will be described with reference to the second comparative example.

A continuity resistance caused by a semiconductor element on a path through which a signal passes is a factor that causes a signal loss in a switch device. A continuity resistance is an electric resistance component at the time of passage of a signal through a switch element in the conduction state, is, in the present specification, a resistance component at the time of passage of a signal through a semiconductor element, and is a drain-source resistance component in an FET when a semiconductor element is formed of the FET. That is, the increase in the number of semiconductor elements on a path through which a signal passes leads to the increase in resistance component of the semiconductor elements in a switch device, and a signal loss therefore increases.

Figure 6:
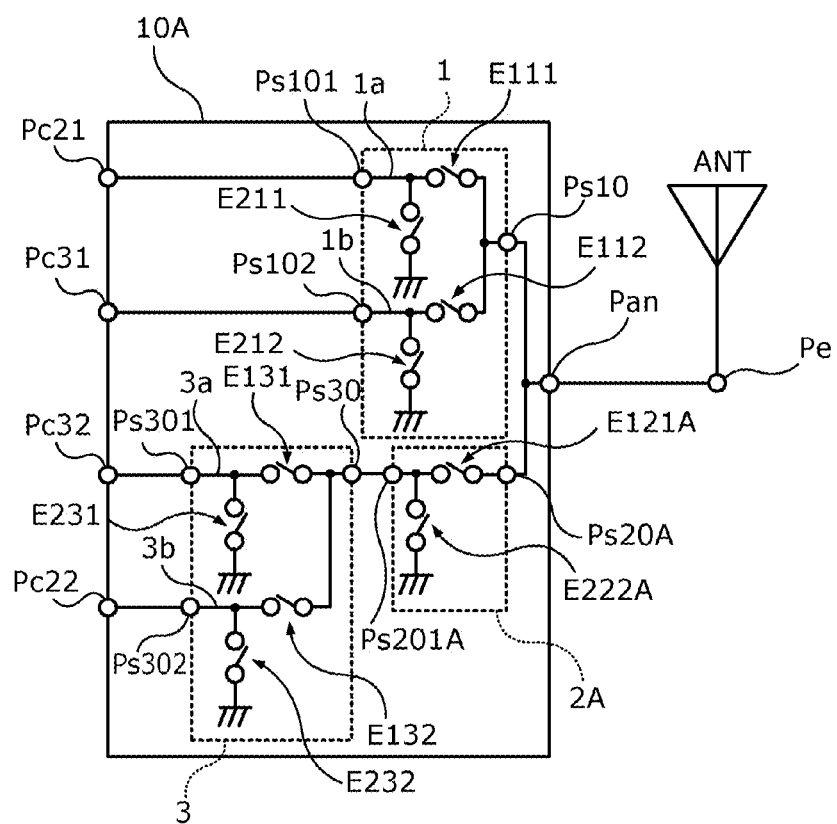
FIG. 6 is a circuit diagram of a switch device according to a second comparative example.
Figure 7:
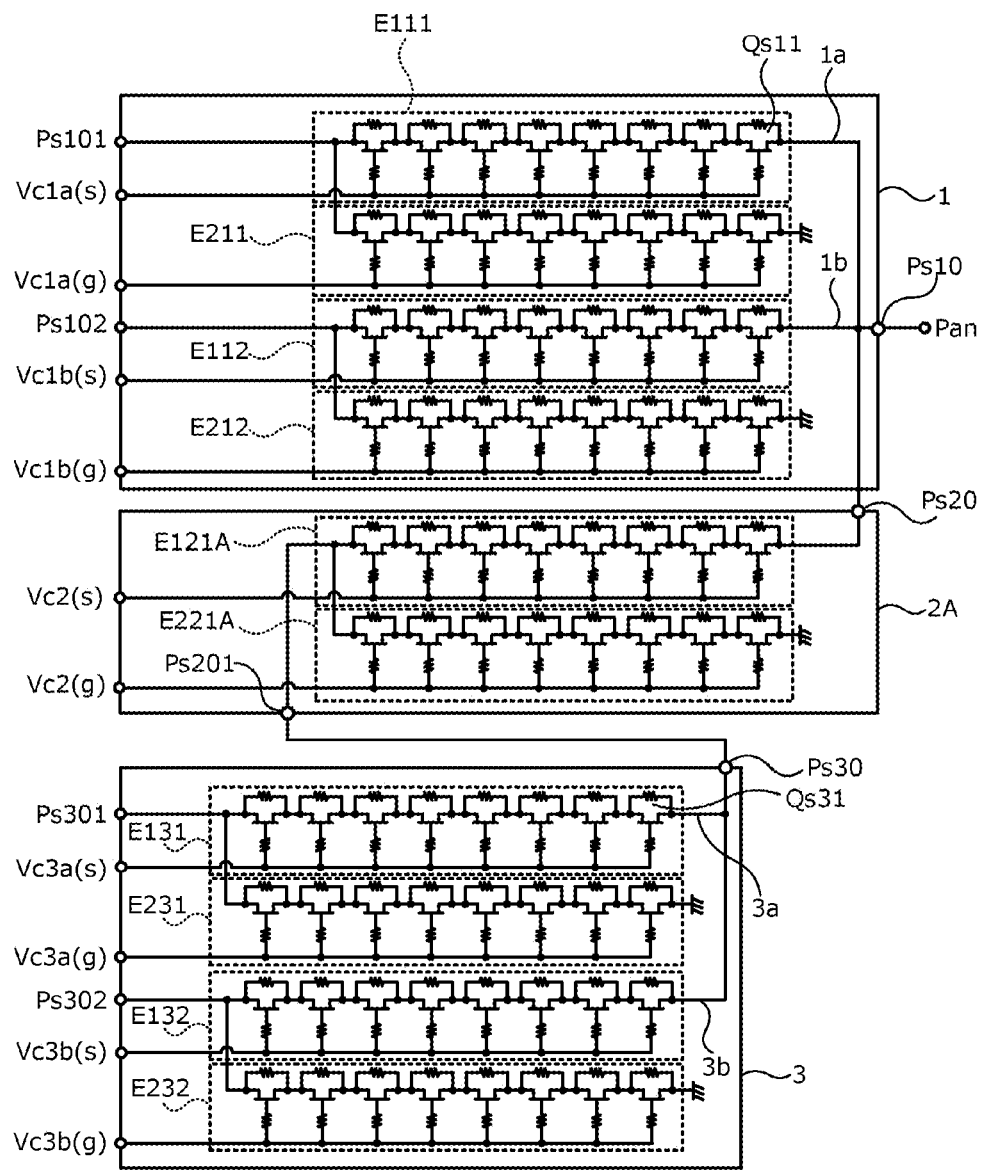
FIG. 7 is a circuit diagram illustrating a switch device according to the second comparative example using semiconductor elements.

FIG. 6 is a detailed circuit diagram of a switch device 10A according to the second comparative example. FIG. 7 is a circuit diagram illustrating the switch device 10A using semiconductor elements. As illustrated in FIGS. 6 and 7, the switch device 10A according to the second comparative example includes a switch circuit 2A instead of the switch circuit 2 according to the first embodiment.

The switch circuit 2A illustrated in FIGS. 6 and 7 differs from the switch circuit 2 illustrated in FIGS. 2 and 3 in that it includes a switch element E121A in which eight FETs are stacked instead of the switch element E121 including a single FET and further includes a switch element E222A connected between the terminal Ps201A and the ground. The switch element E121A and the switch element E222A exclusively operate.

The switch device 10A according to the second comparative example having the above configuration can reduce a mismatch loss because of the cascade connection between the switch circuits 2A and 3, but causes a second problem that a signal loss due to the continuity resistance of a switch element increases on a signal path passing through the cascade-connected switch circuits 2A and 3 as compared with on a signal path passing through the switch circuit 1 including no cascade connection.

Specifically, on the signal path passing through the switch circuit 1 including no cascade-connection, a signal loss is caused by the continuity resistances of eight FETs included in the switch circuit 1. On the other hand, on the signal path passing through the cascade-connected switch circuits 2A and 3 in the second comparative example, a loss is caused by eight FETs included in the switch element E121A in the switch circuit 2A and eight FETs included in the switch element E131 or E132 in the switch circuit 3, totaling sixteen FETs.

Since the number of FETs included in the switch element E121 in the switch circuit 2 is set to one in the first embodiment, a loss caused on the signal path passing through the cascade-connected switch circuits 2 and 3 can be reduced.

Figure 8:
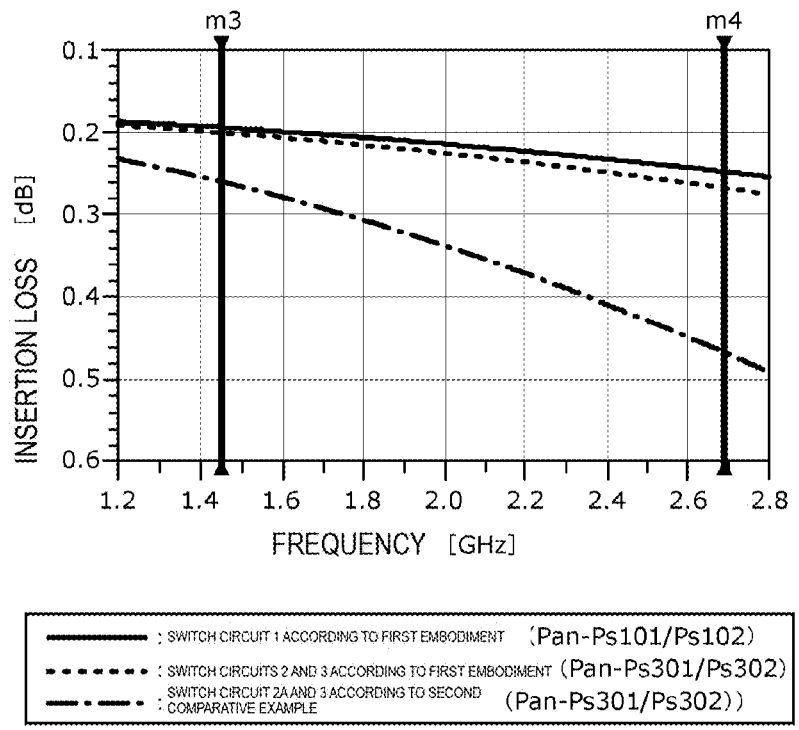
FIG. 8 is a graph representing insertion losses of a switch circuit according to the first embodiment and a switch circuit according to the second comparative example.

FIG. 8 is a diagram illustrating simulation results of insertion losses of the switch device 10A according to the second comparative example and the switch device 10 according to the first embodiment. Specifically, a solid line in FIG. 8 represents an insertion loss relative to the frequency of a radio frequency signal flowing when the conduction between the common terminal Pan and the terminal Ps101 or Ps102 in the first embodiment is established. A broken line represents an insertion loss relative to the frequency of a radio frequency signal flowing when the conduction between the common terminal Pan and the terminal Ps301 or Ps302 in the first embodiment is established. A dot-and-dash line represents an insertion loss relative to the frequency of a radio frequency signal flowing when the conduction between the common terminal Pan and the terminal Ps301 or Ps302 in the second comparative example is established.

First, the relationship between the solid line and the broken line will be described. When the path represented by the solid line which includes no cascade connection (the path between the common terminal Pan and the terminal Ps101) and the path represented by the broken line which includes a cascade connection (the path between the common terminal Pan and the terminal Ps301) are compared, an insertion loss is large on the path including a cascade connection because the number of FETs is large.

Next, the relationship between the broken line and the dot-and-dash line will be described. When the path represented by the broken line which includes a cascade connection in the first embodiment (the path between the common terminal Pan and the terminal Ps301 illustrated in FIG. 2) and the path represented by the dot-and-dash line which includes a cascade connection in the second comparative example (the path between the common terminal Pan and the terminal Ps301 illustrated in FIG. 6) are compared, it is apparent that the reduction in insertion loss is achieved in the first embodiment as compared with in the second comparative example.

That is, an insertion loss can be reduced by employing the configuration according to the first embodiment for the path including a cascade connection. It is apparent that an insertion loss suppression effect increases with the increase in frequency, and this employment is particularly effective in a high-frequency region.

The pressure resistances of the switch device 10 according to the first embodiment and the switch device 10A according to the second comparative example will be described by comparing the first embodiment and the second comparative example. In comparison between FIGS. 2 and 6, the switch element E222A is not provided in the first embodiment illustrated in FIG. 2 while the switch element E222A is provided in the second comparative example illustrated in FIG. 6. That is, in the switch device 10 according to the first embodiment, the path which connects the ground and the path connecting the terminals Ps20 and Ps201 and on which a switch element is disposed is not provided. From the viewpoint of a pressure resistance, the switch circuits 2 and 3 function as a so-called single switch and the voltage of another path is not applied to only the switch circuit 2, but is applied to the switch circuits 2 and 3.

In the switch device 10A according to the second comparative example in which the switch element E222A is provided, the voltage of another path is applied to the switch element E121A in the switch circuit 2A when the switch element E121A is in the non-conduction state irrespective of whether the switch circuit 3 is in the conduction state or the non-conduction state. Accordingly, the switch element E121A requires the increase in the number of stacks for ensuring a pressure resistance, and a signal becomes large as a result.

That is, since the path which connects the ground and the path connecting the terminals Ps20 and Ps201 and on which a switch element is disposed is not provided in the switch device 10 according to the first embodiment, an applied voltage is divided by the switch element E121 in the switch circuit 2 and the switch element E131 in the switch circuit 3.

More specifically, in the switch device 10 according to the first embodiment, a switch element is not disposed on the path connecting the ground and the path between the terminals Ps20 and Ps30 in the switch circuit 2. Accordingly, the switch elements E121 and E131 are connected in series and the switch elements E121 and E132 are connected in series. The switch elements E121 and E131 are directly connected, and the switch element E231 is disposed between the ground and each of the switch element E131 and terminal Ps301. The switch elements E121 and E132 are directly connected, and the switch element E232 is disposed between the ground and each of the switch element E132 and the terminal Ps302.

With such connection relationship, the switch device 10 operates like a so-called SP2T-type switch for selectively connecting either the terminal Ps301 or Ps302 to the terminal Ps20. The voltage of another path is not therefore applied to only the switch circuit 2. That is, the switch element E121 according to the first embodiment can ensure a pressure resistance with a smaller number of stacks as compared with the switch element E121A according to the second comparative example.

3. Structure

The structure of an FET included in each switch element according to the first embodiment will be described. In the case where a switch element is an FET switch, that is, a semiconductor element included in a switch element is an FET, the continuity resistance of an FET included in a switch element can be determined in accordance with the gate width of the FET.

Figure 9A:
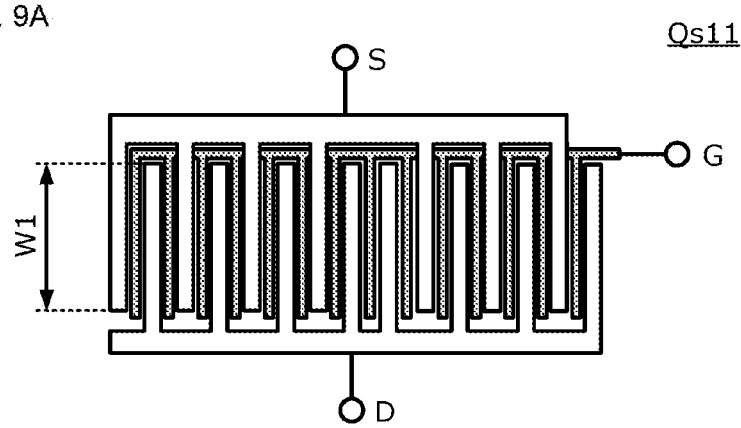
FIG. 9A is a first diagram illustrating in detail a semiconductor element according to the first embodiment.
Figure 9B:
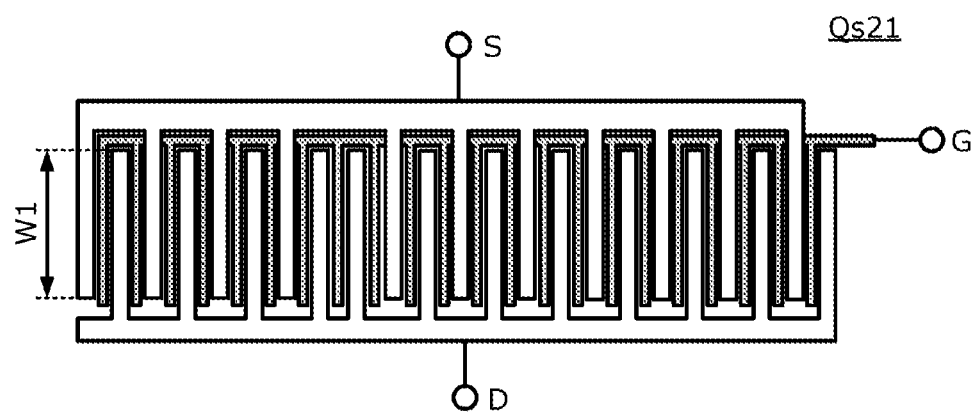
FIG. 9B is a second diagram illustrating in detail a semiconductor element according to the first embodiment.
Figure 9C:
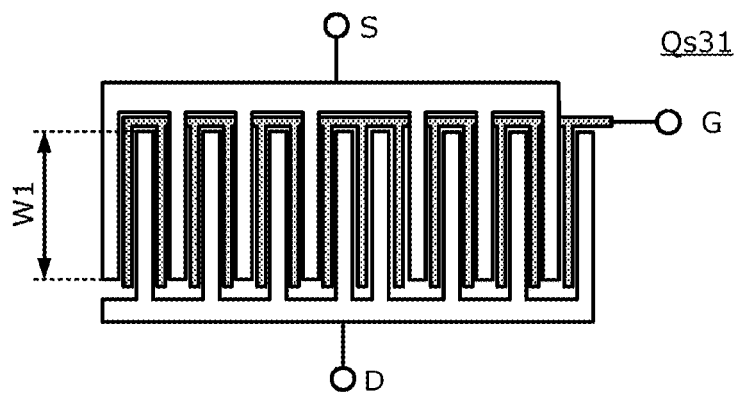
FIG. 9C is a third diagram illustrating in detail a semiconductor element according to the first embodiment.

The relationship of a gate width will be described with reference to FIGS. 9A to 9C. FIG. 9A is a diagram illustrating in detail Qs11 that is one of FETs included in the switch element E111 in the switch circuit 1. FIG. 9B is a diagram illustrating in detail Qs21 that is one of FETs included in the switch element E121 in the switch circuit 2. FIG. 9C is a diagram illustrating in detail Qs31 that is one of FETs included in the switch element E131 in the switch circuit 3.

A gate width is represented by the product of a width (finger width) W1 of a gate electrode and the number of gate electrodes (the number of fingers). Specifically, the width of a gate electrode represents a length along which the gate electrode faces a drain or source electrode in an FET. In comparison between FIG. 9A to 9C, the finger widths W1 of the FET elements Qs11, Qs21, and Qs31 are equal. The number of fingers in the FET element Qs21 is larger than that in the FET elements Qs11 and Qs31. For example, the number of fingers in the FET element Qs21 is 21 and the numbers of fingers in the FET elements Qs11 and Qs31 are 14.

That is, as illustrated in FIGS. 9A and 9B, the gate width of an FET element Qs21 in the switch circuit 2 is larger than that of an FET element Qs11 in the switch circuit 1. As illustrated in FIGS. 9B and 9C, the gate width of the FET element Qs21 in the switch circuit 2 is larger than that of an FET element Qs31 in the switch circuit 3.

The continuity resistance of a switch element generally becomes lower with the increase in the gate width of the switch element. Accordingly, the continuity resistance of the FET element Qs21 in the switch circuit 2 is lower than that of the FET element Qs11 in the switch circuit 1. The continuity resistance of the FET element Qs21 in the switch circuit 2 is lower than that of the FET element Qs31 in the switch circuit 3.

The FET elements Qs11, Qs21, and Qs31 do not necessarily have to have the same finger width. For example, in the case where the numbers of fingers of the FET elements Qs21 and Qs11 are equal, the finger width of the FET element Qs21 may be wider than that of the FET element Qs11. Also in this case, the gate width of the FET element Qs21 is wider than that of the FET element Qs11. Respective FET element does not necessarily have to have the same finger width or the same number of fingers.

In the case where two FET elements have the same gate width, the continuity resistance of one of the FET elements including a larger number of gate electrodes is lower than that of the other one of the FET elements including a smaller number or gate electrodes.

4. Summarization

As described above, the switch device 10 according to the present embodiment can suppress a stray capacitance by including the cascade-connected switch circuits 2 and 3 and therefore reduce a mismatch loss as a result. The number of stacks of semiconductor elements in the switch element E121 in the switch circuit 2 is smaller than that in the switch element E111 in the switch circuit 1. Accordingly, the number of stacks of semiconductor elements on the path from the cascade-connected switch circuits 2 and 3 to the common terminal Pan can be reduced. As a result, a signal loss due to a continuity resistance at the time of the passage of a radio frequency signal through a semiconductor element can be reduced. That is, with the switch device 10 according to the present embodiment, a mismatch loss can be reduced and a signal loss due to a continuity resistance can also be reduced.

According to the present embodiment, the switch circuits 1 and 3 include not only the switch elements E111, E112, E131, and E132 disposed on the paths connecting the common terminal Pan and the terminals Pc21, Pc31, Pc32, and Pc22 but also the switch elements E211, E212, E231, and E232 disposed on the paths connecting the paths and the ground. The switch elements E211 and E111, the switch elements E212 and E112, the switch elements E231 and E131, and the switch elements E232 and E132 exclusively operate.

With this configuration, the isolation between the paths connecting the common terminal Pan and the terminals Pc21, Pc31, Pc32, and Pc22 can be improved.

According to the present embodiment, the number of stacks of semiconductor elements in the switch element E121 in the switch circuit 2 is smaller than that in the switch element E131 in the switch circuit 3.

With this configuration, the number of stacks of semiconductor elements on the path including the cascade-connected switch circuits 2 and 3 can be suppressed and a signal loss on the path can therefore be further suppressed.

Since the stray capacitance of the switch device 10 can be reduced when the switch element E121 is in the non-conduction state, a signal loss due to a mismatch loss can be further suppressed at that time. Specifically, a signal loss due to a continuity resistance does not change irrespective of the number of stacks of semiconductor elements in the switch element E121 on condition that the sum total of the number of stacks of semiconductor elements in the switch element E121 in the switch circuit 2 and the number of stacks of semiconductor elements in the switch element E131 in the switch circuit 3 is constant. However, when the switch element E121 is in the non-conduction state, the number of stacks of semiconductor elements in the switch element E121 in the switch circuit 2 is more dominant influence on a stray capacitance that is a capacitance generated between the common terminal Pan of the switch device 10 and the ground than the number of stacks of semiconductor elements in the switch element E131 in the switch circuit 3. Accordingly, an insertion loss due to an impedance mismatch can be reduced by setting the number of stacks of semiconductor elements in the switch element E121 to be smaller than that in the switch element E131.

The relationship of the number of stacks of semiconductor elements described using the switch elements E121 and E131 and the effects obtained from the relationship are also applied to a switch element E121 and the switch element E132.

According to the present embodiment, the number of stacks of semiconductor elements in the switch element E121 in the switch circuit 2 is one.

With this configuration, the number of stacks of semiconductor elements on the path from the switch circuits 2 and 3 to the common terminal Pan can be further suppressed. As a result, a signal loss due to a continuity resistance at the time of passage of a radio frequency signal through a semiconductor element can be further suppressed. In addition, a capacitance (off capacitance) that is a parasitic component when the switch element E121 in the switch circuit 2 is in the non-conduction state can be reduced, and a signal loss due to an impedance mismatch loss can be further suppressed.

The number of stacks of semiconductor elements in the switch element E121 may be two or more.

According to the present embodiment, when the conduction between the terminals Ps20 and Ps201 in the switch circuit 2 is not established, the conduction between the terminal Ps30 and each of the multiple terminals Ps301 and Ps302 in the switch circuit 3 is not established.

In this case, a voltage divided by the switch circuits 2 and 3 is applied to the switch circuit 2. Accordingly, a pressure resistance required for the switch circuit 2 can be reduced, and the number of stacks of semiconductor elements in the switch element E121 in the switch circuit 2 can therefore be reduced.

Depending on a device (filter) connected to the switch circuit 3, there may be a frequency at which an impedance appears to be short-circuited. In this case, if the switch circuit 3 is in the conduction state and the switch circuit 2 is in the non-conduction state, a voltage applied to the switch circuit 2 tends to be higher. By bringing the switch circuit 3 into the non-conduction state when the switch circuit 2 is in the non-conduction state, the breakage of the switch circuit 2 caused by the application of a voltage exceeding the pressure resistance to the switch circuit 2 can be prevented.

In the present specification, a state in which the non-conduction between a common terminal and all of to-be-selected terminals in a switch circuit is established is referred to as the non-conduction of the switch circuit and the state in which the conduction between the common terminal and at least one of the to-be-selected terminals is established is referred to as the conduction of the switch circuit.

In the present embodiment, the switch circuit 2 is formed of only the switch element E121.

The switch circuit 2 can therefore be miniaturized. From the viewpoint of a pressure resistance, the switch circuits 2 and 3 function as a so-called single switch and the voltage of another path is not applied to only the switch circuit 2 and is applied to the switch circuits 2 and 3. As a result, a stray capacitance viewed from the common terminal Pan can be reduced and a signal loss can be further suppressed.

The switch circuit 2 may include the switch element E222A illustrated in FIG. 6.

With the radio-frequency front-end circuit 5 including the switch device 10 having the above configuration, a mismatch loss can be reduced and a signal loss due to a continuity resistance can also be reduced. Accordingly, a large number of bands can be supported while a loss is reduced.

Modification of First Embodiment

Next, a radio-frequency front-end circuit 5B including a switch device according to a modification of the first embodiment will be described with reference to drawings.

Figure 10:
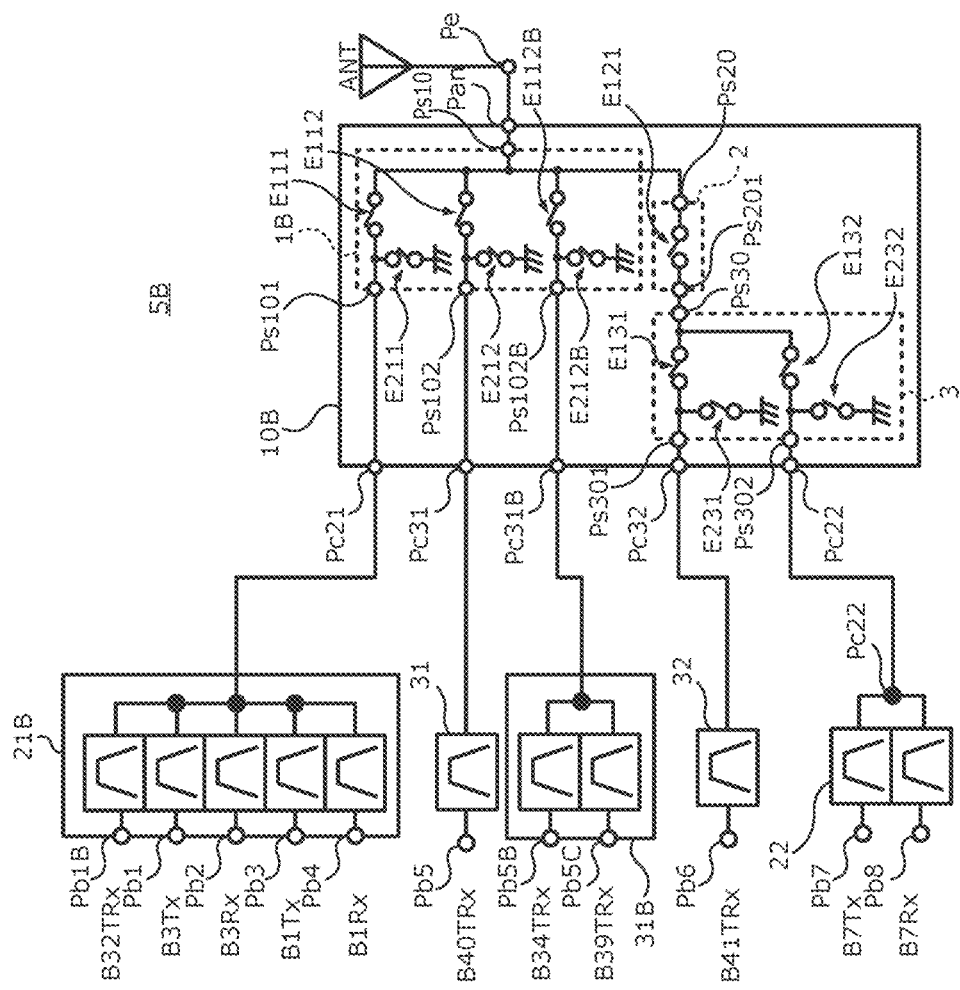
FIG. 10 is a circuit diagram of a radio-frequency front-end circuit including a switch device according to a modification.

FIG. 10 is a circuit diagram of a radio-frequency front-end circuit 5B including a switch device 10B according to a modification. The switch device 10B according to the present modification differs from the switch device 10 according to the first embodiment in that it further includes a terminal Pc31B that is a to-be-selected terminal and includes an SP3T-type switch circuit 1B instead of the SPDT-type switch circuit 1. As compared with the switch circuit 1, the switch circuit 1B further includes a terminal Ps102B connected to the terminal Pc31B, a switch element E112B connected between the terminals Ps10 and Ps102B, and a switch element E212B connected between the terminal Ps102B and the ground.

The radio-frequency front-end circuit 5B according to the present modification includes a multiplexer 21B for Band32, Band3, and Band1, the multiplexer 22 for Band7, the filter 31 for Band40, a multiplexer 31B for Band34 and Band39, and the filter 32 for Band41 in addition to the switch device 10B.

The characteristics of the radio-frequency front-end circuit 5B having the above configuration will be described below.

FIGS. 11A, 11B, 11C, 12A, 12B, 13A, 13B, 14A, and 14B illustrate simulation results of an insertion loss relative to the frequency of a radio frequency signal flowing through each path in the radio-frequency front-end circuit 5B according to the present modification.

Figure 11A:
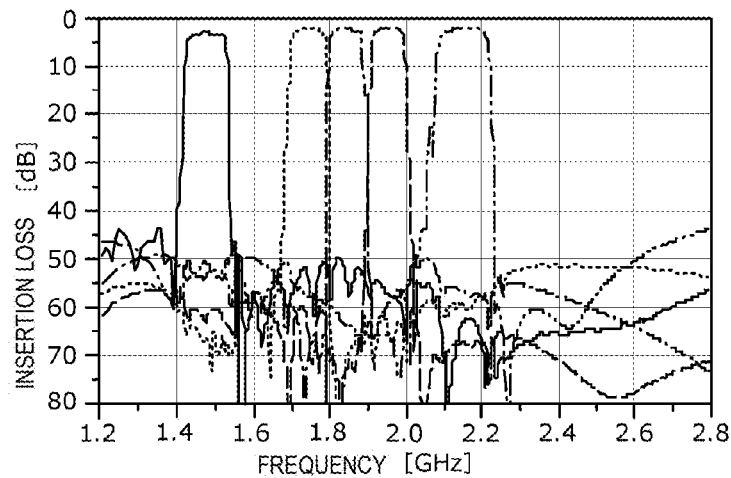
FIG. 11A is a first graph representing an insertion loss of a radio-frequency front-end circuit according to a modification.
Figure 11B:
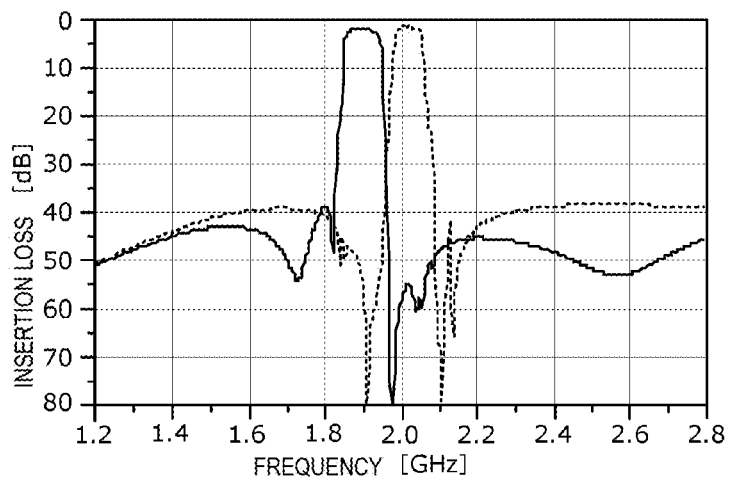
FIG. 11B is a second graph representing an insertion loss of a radio-frequency front-end circuit according to a modification.
Figure 11C:
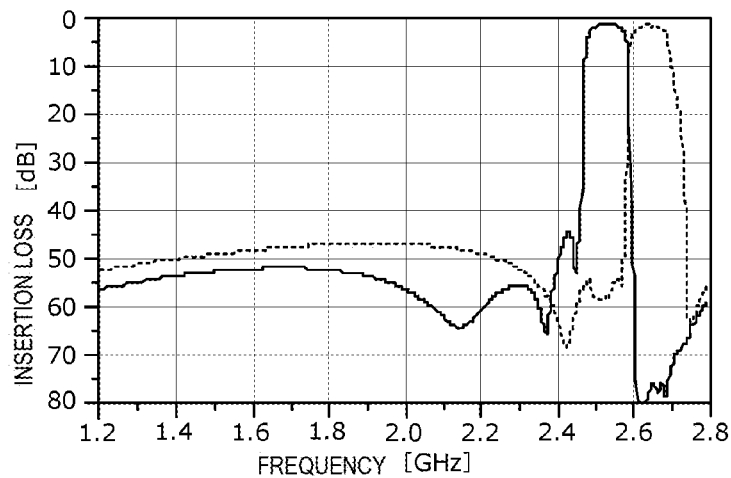
FIG. 11C is a third graph representing an insertion loss of a radio-frequency front-end circuit according to a modification.
Figure 12A:
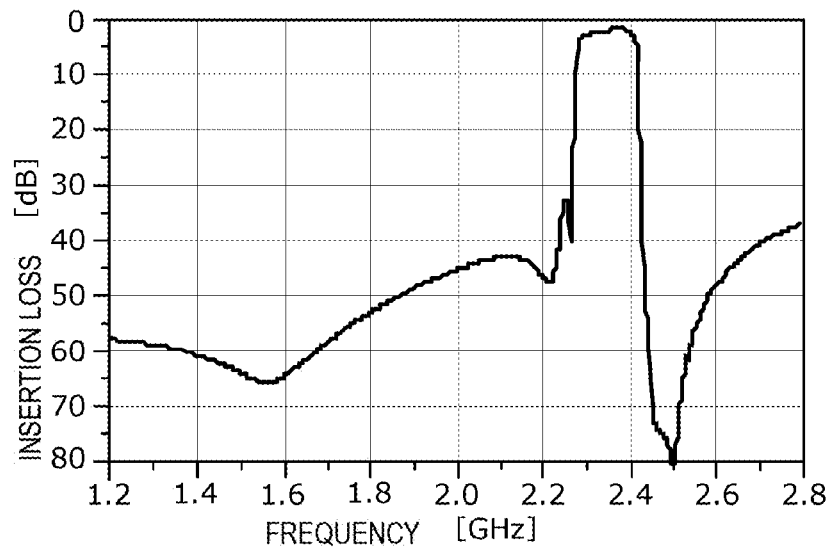
FIG. 12A is a fourth graph representing an insertion loss of a radio-frequency front-end circuit according to a modification.
Figure 12B:
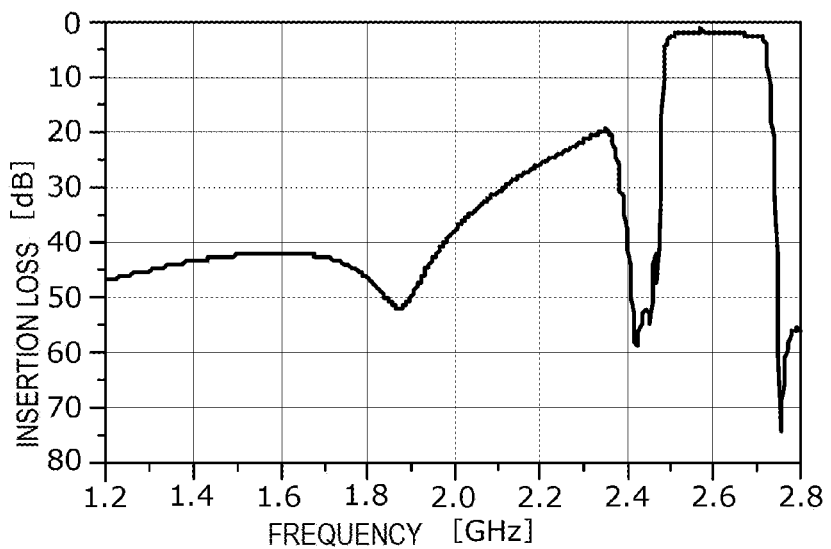
FIG. 12B is a fifth graph representing an insertion loss of a radio-frequency front-end circuit according to a modification.

FIGS. 11A to 11C, 12A, and 12B illustrate simulation results in a state in which only one device is connected to the common terminal Pan. Specifically, FIG. 11A illustrates a simulation result in a state in which only the multiplexer 21B for Band32, Band3, and Band1 is connected to the common terminal Pan. FIG. 11B illustrates a simulation result in a state in which only the multiplexer 31B for Band34 and Band39 is connected to the common terminal Pan. FIG. 11C illustrates a simulation result in a state in which only the filter 32 for Band7 is connected to the common terminal Pan. FIG. 12A illustrates a simulation result in a state in which only the filter 31 for Band40 is connected to the common terminal Pan. FIG. 12B illustrates a simulation result in a state in which only the filter 32 for Band41 is connected to the common terminal Pan.

Figure 13A:
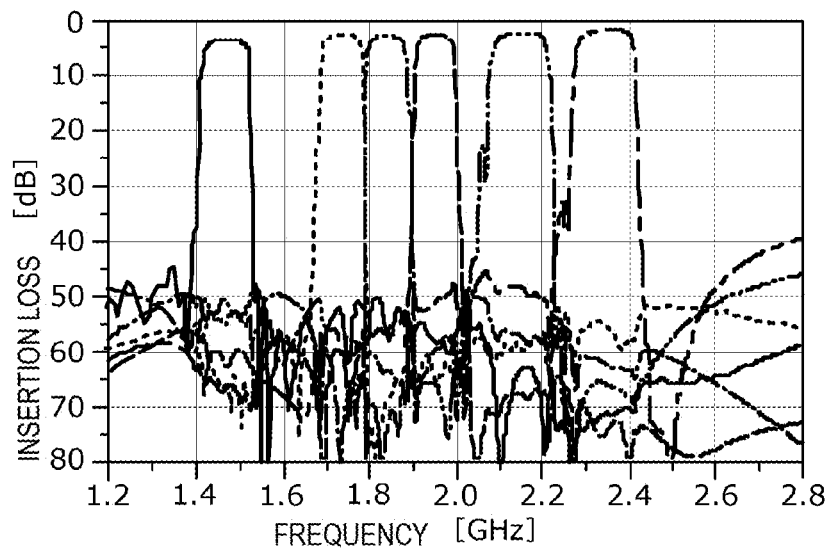
FIG. 13A is a sixth graph representing an insertion loss of a radio-frequency front-end circuit according to a modification.
Figure 13B:
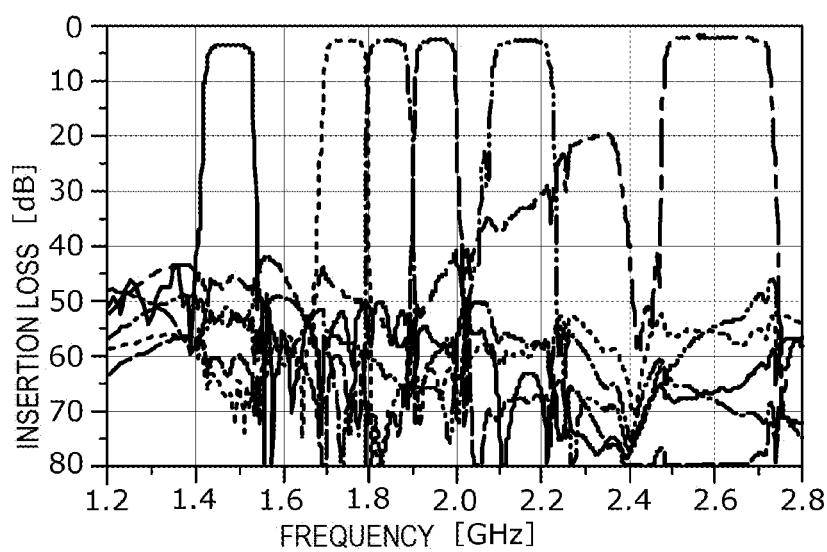
FIG. 13B is a seventh graph representing an insertion loss of a radio-frequency front-end circuit according to a modification.
Figure 14A:
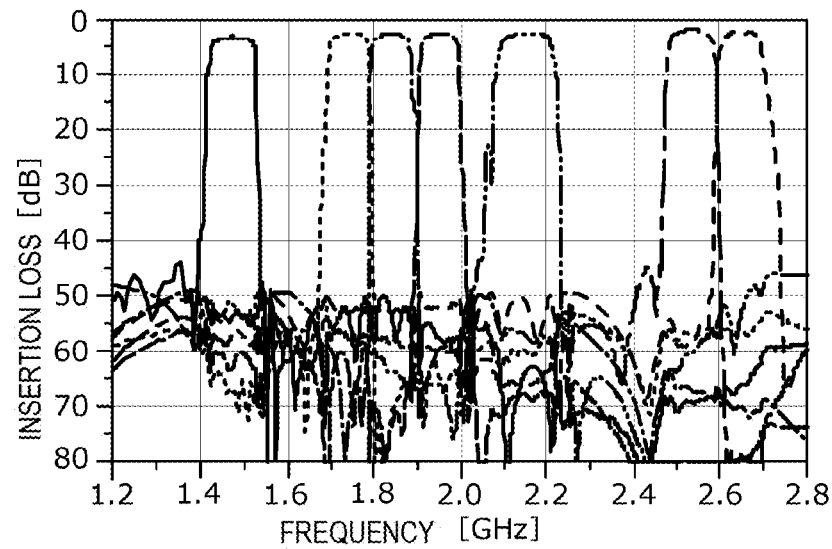
FIG. 14A is an eighth graph representing an insertion loss of a radio-frequency front-end circuit according to a modification.
Figure 14B:
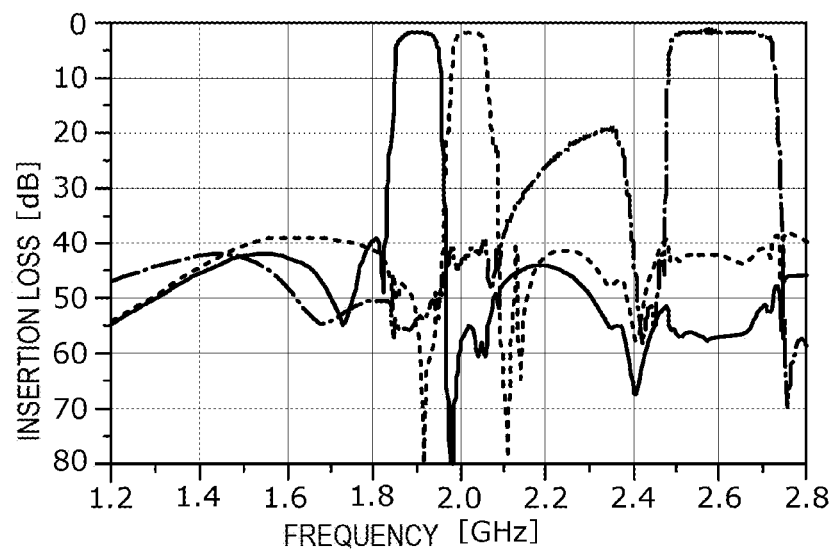
FIG. 14B is a ninth graph representing an insertion loss of a radio-frequency front-end circuit according to a modification.

FIGS. 13A, 13B, 14A, and 14B illustrate simulation results in a state in which two devices are connected to the common terminal Pan. FIG. 13A illustrates a simulation result in a state in which the multiplexer 21B for Band32, Band3, and Band1 and the filter 31 for Band40 are connected to the common terminal Pan. FIG. 13B illustrates a simulation result in a state in which the multiplexer 21B for Band32, Band3, and Band1 and the filter 32 for Band41 are connected to the common terminal Pan. FIG. 14A illustrates a simulation result in a state in which the multiplexer 21B for Band32, Band3, and Band1 and the filter 32 for Band7 are connected to the common terminal Pan. FIG. 14B illustrates a simulation result in a state in which the multiplexer 31B for Band34 and Band39 and the filter 32 for Band41 are connected to the common terminal Pan.

Figure 15:
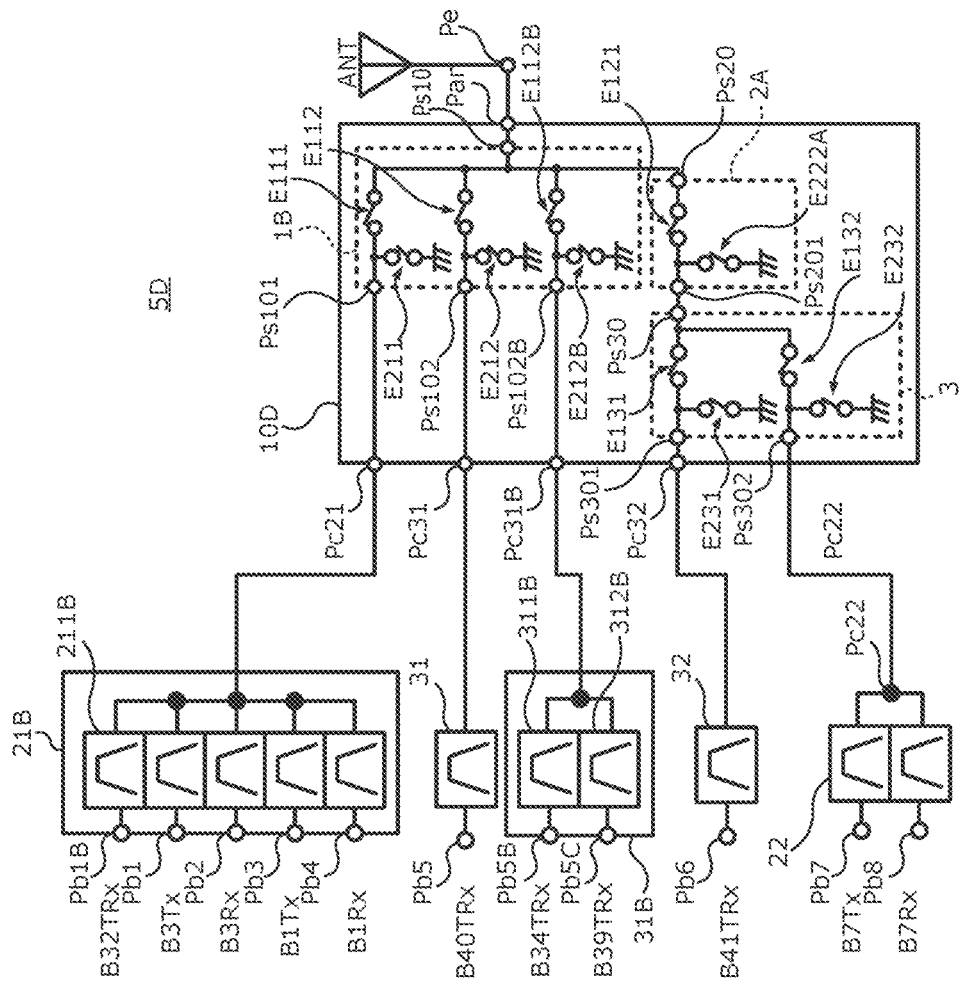
FIG. 15 is a circuit diagram of a radio-frequency front-end circuit including a switch device according to a third comparative example.

The effects produced by the present modification will be described below using a third comparative example. FIG. 15 is a circuit diagram of a radio-frequency front-end circuit 5D including a switch device 10D according to the third comparative example. The switch device 10D according to the third comparative example differs from the switch device 10B according to the modification of the first embodiment in that it includes the switch circuit 2A described in the second comparative example instead of the switch circuit 2. Table 1 indicates insertion losses of radio frequency signals flowing through respective paths in the modification and the third comparative example. Table 1 indicates the maximum value of an insertion loss in a passband of a band illustrated in the uppermost line when a filter or a multiplexer corresponding to a band illustrated in the leftmost column is connected to the common terminal Pan. In the present specification, "B" represents Band, "Tx" represents a transmission band, "Rx" represents a reception band, and "TRx" represents a transmission/reception band in the drawings or the table, and, for example, the transmission/reception band of Band41 is represented by "B41TRx".

Band7 passing through the path on which the switch circuits 2A and 3 are cascade-connected can also be reduced in the modification of the first embodiment by reducing the number of semiconductor elements on the path. Like in the first embodiment, the insertion loss of a radio frequency signal in a band due to an impedance mismatch which passes through a path different from the path on which the switch circuits 2A and 3 are cascade-connected can also be reduced in the modification of the first embodiment because the stray capacitance of the switch circuit 1B can be reduced.

For example, a transmission filter for PC2 (Power Class 2) may be connected to the switch circuit 1 different from the cascade-connected switch circuits 2A and 3.

In a band for which comparatively high transmission power is required, this configuration allows a signal to be transmitted to the common terminal Pan while a signal loss is reduced and power is maintained.

For example, a transmission filter for PC3 (Power Class 3) may be connected to the cascade-connected switch circuits 2A and 3. That is, a transmission filter, the maximum transmission power of which is comparatively low, may be connected to the switch circuit 3 including a cascade connection.

A power class is a UE output power classification defined by, for example, the maximum output power. The smaller the value of a power class, the higher the permissible output power. For example, in the 3GPP®, the permissible maximum output power in Power Class 1 is 31 dBm, the permissible maximum output power in Power Class 1.5 is 29 dBm, the permissible maximum output power in Power Class 2 is 26 dBm, and the permissible maximum output power in Power Class 3 is 23 dBm.

Second Embodiment

With the increase in the number of devices (filters) that are connected to a switch device for the recent support for multi-band operation, the stray capacitance of the switch device increases. Accordingly, there may be the case where a mismatch loss cannot be sufficiently reduced even with a switch device according to the first embodiment. In the second embodiment, descriptions will be made focusing on a matching circuit that is effective in suppressing the mismatch loss of a switch device.

TABLE 1

|  | Modification of First Embodiment | | | Third Comparative Example | | |
| --- | --- | --- | --- | --- | --- | --- |
|  | B41TRx | B7Tx | B7Rx | B41TRx | B7Tx | B7Rx |
| B41 | 2.67 [dB] |  |  | 2.87 [dB] |  |  |
| B7 |  | 2.47 [dB] | 2.89 [dB] |  | 2.62 [dB] | 3.08 [dB] |
| B32, B3, B1, B7 |  | 2.79 [dB] | 2.91 [dB] |  | 2.93 [dB] | 3.11 [dB] |
| B32, B3, B1, B41 | 3.00 [dB] |  |  | 3.18 [dB] |  |  |
| B39, B34, B41 | 3.13 [ dB] |  |  | 3.34 [dB] |  |  |

Figure 16:
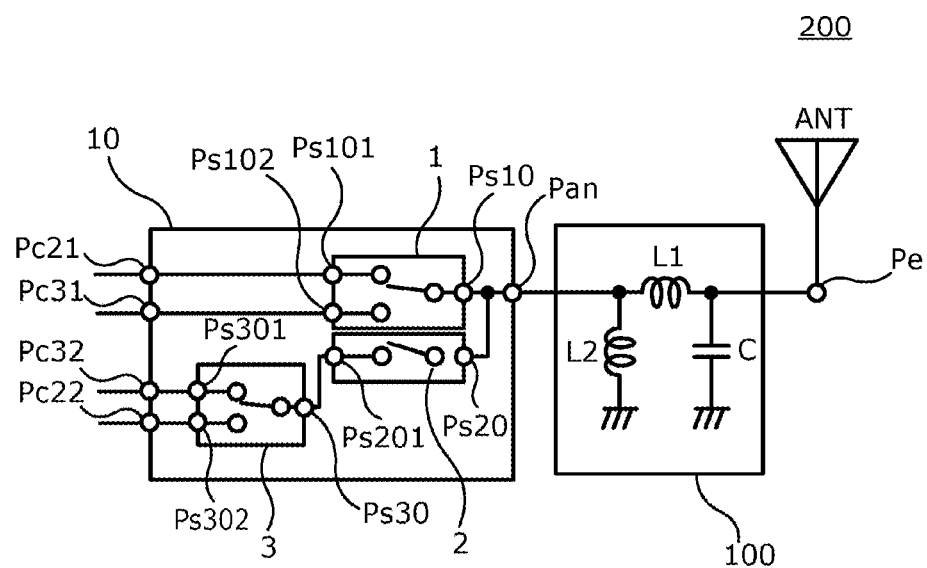
FIG. 16 is a circuit diagram of a radio-frequency front-end circuit according to a second embodiment.

It is apparent from Table 1 that, in all cases, the maximum value of an insertion loss in a band in the modification of the first embodiment is smaller than that in the third comparative example. Specifically, like in the first embodiment, the insertion losses of radio frequency signals in Band41 and FIG. 16 is a circuit diagram of a radio-frequency front-end circuit 200 according to the second embodiment. As compared with the radio-frequency front-end circuit 5 described in the first embodiment, the radio-frequency front-end circuit 200 includes a matching circuit 100 disposed between the common terminal Pan of the switch device 10 and the external terminal Pe of the radio-frequency front-end circuit 200.

The matching circuit 100 is a π-type matching circuit including two inductors L1 and L2 and a single capacitor C. Specifically, the inductor L1 (first inductor) is disposed on the path connecting the common terminal Pan and the external terminal Pe. The inductor L2 (second inductor) is disposed on the path connecting the ground and the path connecting the common terminal Pan and the inductor L1. The capacitor C is disposed on the path connecting the ground and the path connecting the external terminal Pe and the inductor L1.

According to the second embodiment, the increase in a mismatch loss can be suppressed by the matching circuit 100 even if the stray capacitance of the switch device 10 increases.

Figure 17A:
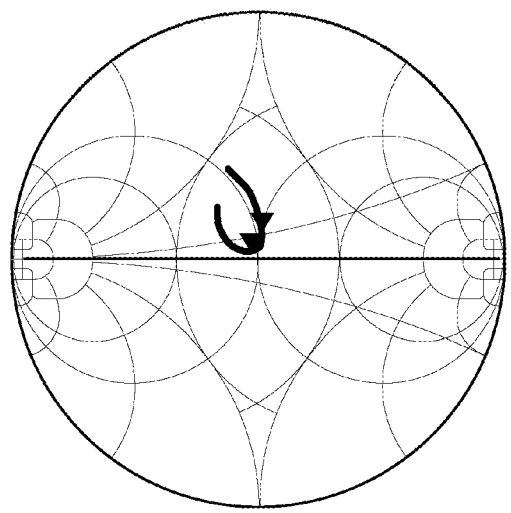
FIG. 17A is a first Smith chart describing the relationship between a stray capacitance and a loss.
Figure 17B:
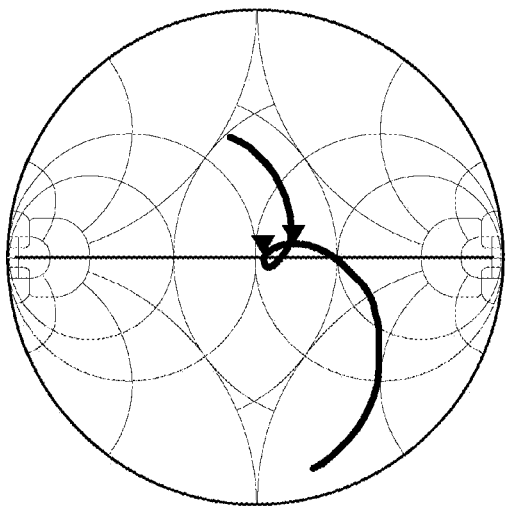
FIG. 17B is a second Smith chart describing the relationship between a stray capacitance and a loss.
Figure 17C:
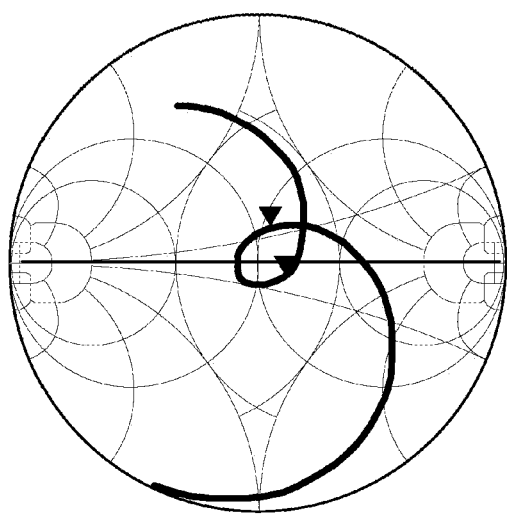
FIG. 17C is a third Smith chart describing the relationship between a stray capacitance and a loss.
Figure 17D:
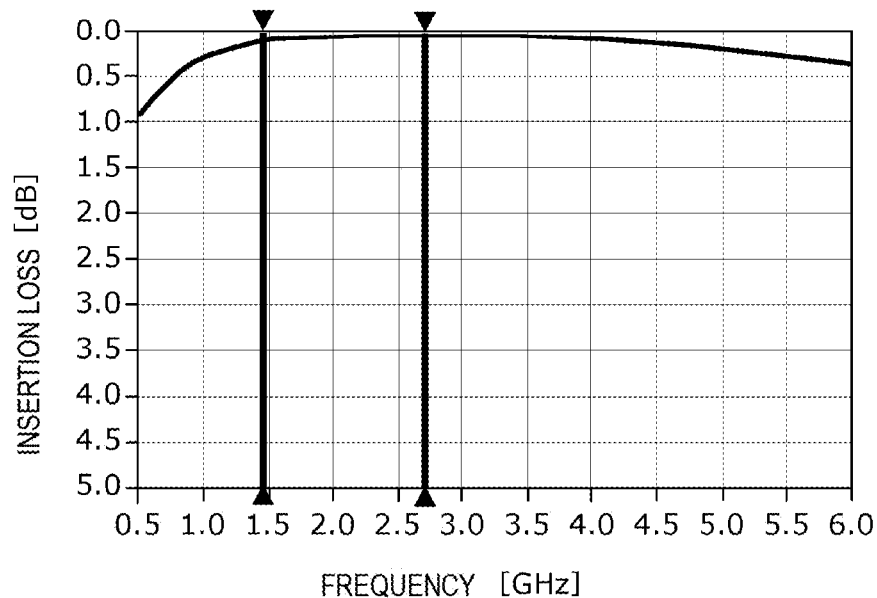
FIG. 17D is a first graph describing the relationship between a stray capacitance and a loss.
Figure 17E:
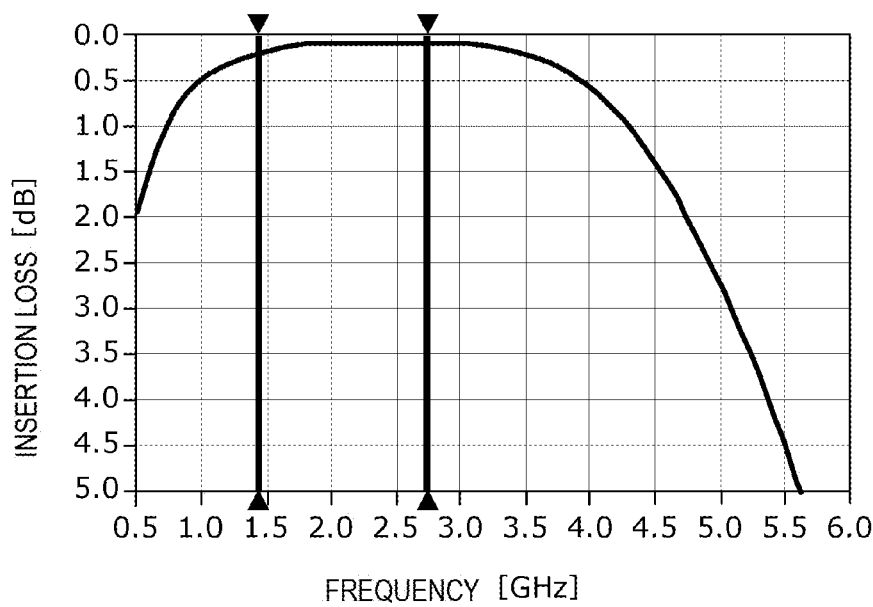
FIG. 17E is a second graph describing the relationship between a stray capacitance and a loss.
Figure 17F:
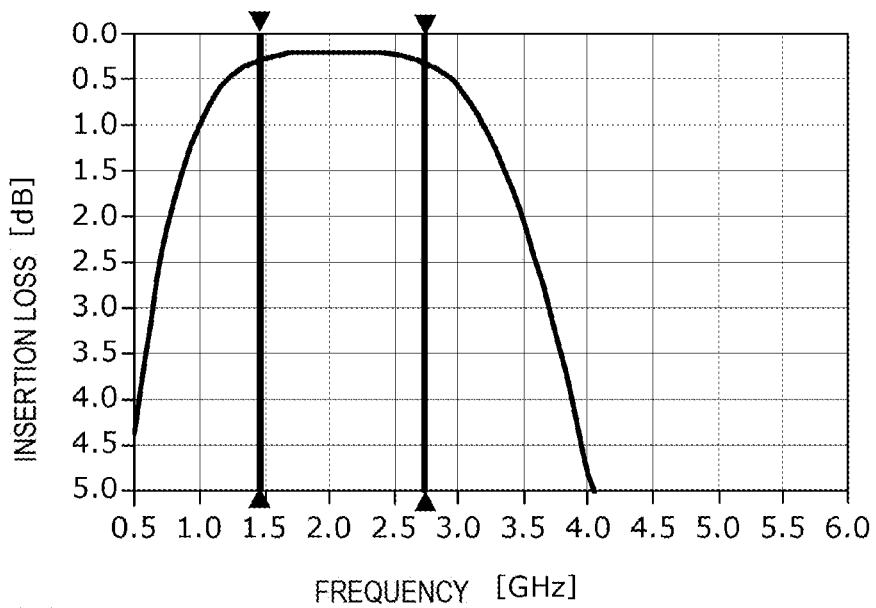
FIG. 17F is a third graph describing the relationship between a stray capacitance and a loss.

FIGS. 17A to 17C and 17D to 17F are graphs describing the relationship between a stray capacitance and a loss. Specifically, FIGS. 17A to 17C are Smith chart representing an impedance when the matching circuit 100 according to the second embodiment is added to the switch device 10, and illustrate impedances when the stray capacitance Cp1 of the switch device 10 is 0.5, 1.0, 2.0 [pF], respectively. FIGS. 17D to 17F are graphs indicating an insertion loss when the matching circuit 100 according to the second embodiment is added to the switch device 10, and illustrate insertion losses when the stray capacitance Cp1 of the switch device 10 is 0.5, 1.0, 2.0 [pF], respectively. In the second embodiment, first to third simulation results representing impedances viewed from the external terminal Pe are represented using Smith charts.

When FIGS. 17A to 17C illustrating an impedance when the matching circuit 100 according to the second embodiment is added are compared with FIGS. 5A to 5C illustrating an impedance when the matching circuit 100 is not present, it is apparent that the trace of an impedance concentrate near the center of the Smith chart in FIGS. 17A to 17C even when the stray capacitances Cp1 are equal. As a result, it is apparent from FIGS. 17D to 17F illustrating an insertion loss when the matching circuit 100 according to the second embodiment is added and FIGS. 5D to 5F illustrating an insertion loss when the matching circuit 100 is not present that an insertion loss at a band end can be reduced even when the stray capacitances Cp1 are equal. That is, with the matching circuit 100 according to the second embodiment, the effect of reducing a mismatch loss at a band end is obtained by reducing an impedance deviation in a band.

A mechanism for obtaining such an effect will be described below with reference to FIGS. 18A to 18D and 18E to 18H. FIGS. 18E to 18H illustrate simulation results representing impedances viewed from the external terminal Pe in the configurations illustrated in FIG. 18A to 18D, respectively. Referring to FIGS. 18E to 18H, a solid line represents the trace of an impedance at a lower-frequency band end and a broken line represents the trace of an impedance at a higher-frequency band end.

Figure 18A:
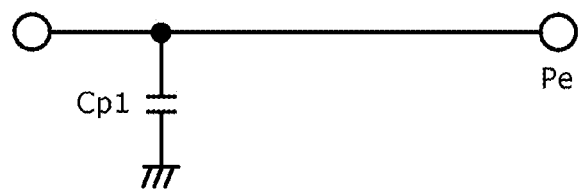
FIG. 18A is a first circuit diagram describing the effect of a matching circuit.
Figure 18B:
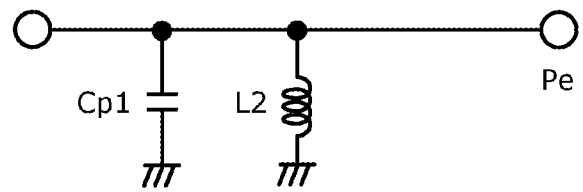
FIG. 18B is a second circuit diagram describing the effect of a matching circuit.
Figure 18C:
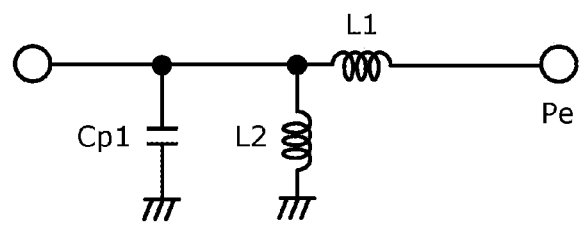
FIG. 18C is a third circuit diagram describing the effect of a matching circuit.
Figure 18D:
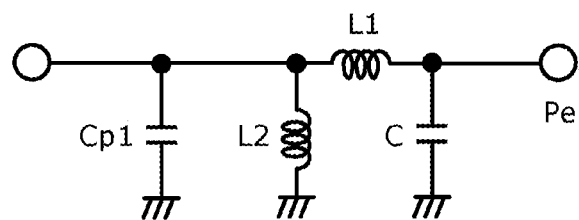
FIG. 18D is a fourth circuit diagram describing the effect of a matching circuit.

FIG. 18A is a circuit diagram illustrating the stray capacitance of the switch device 10 as the stray capacitance Cp1. FIGS. 18B, 18C, and 18D are circuit diagrams illustrating the switch device 10 to which the inductor L2, the inductor L1, and the capacitor C in the matching circuit 100 are added in this order.

As illustrated in FIGS. 18E to 18H, the impedance at the lower-frequency band end represented by the solid line and the impedance at the higher-frequency band end represented by the broken line approach the center of the Smith chart by adding the inductor L2, the inductor L1, and the capacitor C in the matching circuit 100 in this order, although the amount of impedance shift at the time of addition of an element differs at the lower-frequency band end and the higher-frequency band end. As a result, a mismatch loss at the lower-frequency band end and a mismatch loss at the higher-frequency band end can be reduced.

The inductance value of the series inductor L1 is larger than that of the shunt inductor L2. As illustrated in FIGS. 18F and 18G, the amount of impedance shift at the time addition of the inductor L1 can therefore be larger than that at the time addition of the inductor L2. As a result, when the capacitor C is added, the impedance at the lower-frequency band end and the impedance at the higher-frequency band end can easily approach the center of the Smith chart to reduce a mismatch loss.

When the stray capacitance of the switch circuit 1 is represented by C1, the off capacitance of a switch element in the switch circuit 2 is represented by C2, and the stray capacitance of the switch circuit 3 is represented by C3, a capacitance value C4 of the capacitor C may satisfy the relationship of Expression (1) when the switch circuit 2 is in the non-conduction state and the relationship of Expression (2) when the switch circuit 2 is in the conduction state.

[Expression 1]

$$(C1 \cdot C2)/(C1+C2)+C3 \geq C4 \qquad (1)$$

[Expression 2]

$$C1+C3 \geq C4 \qquad (2)$$

That is, when the stray capacitance of the switch device 10 is represented by Cp1, the relationship of Expression (3) may be satisfied.

[Expression 3]

$$Cp1 \geq C4 \qquad (3)$$

Figure 18E:
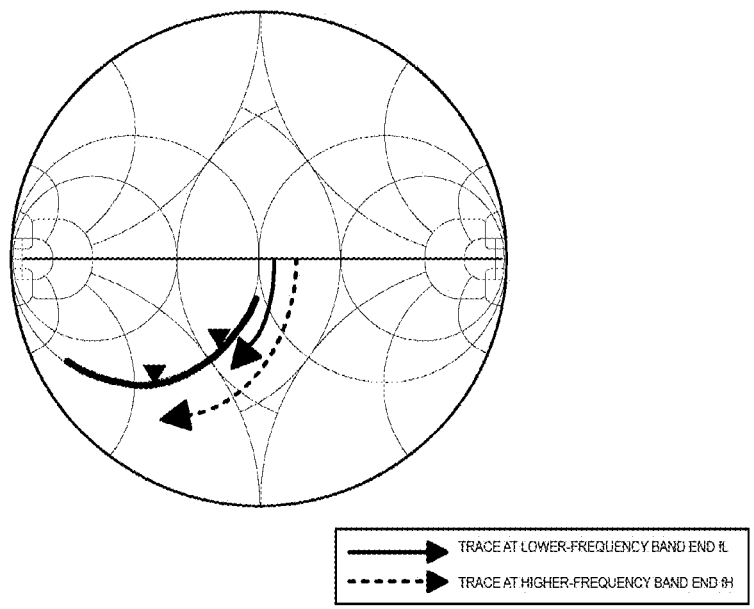
FIG. 18E is a first Smith chart describing the effect of a matching circuit.
Figure 18F:
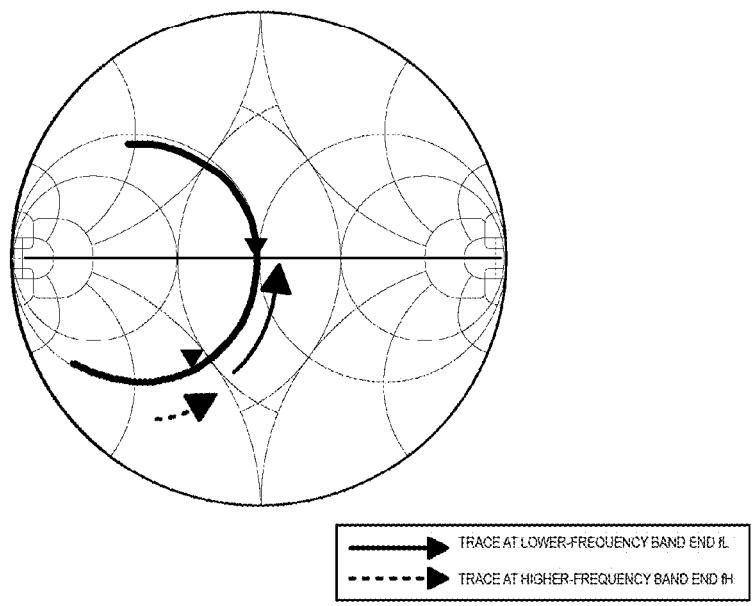
FIG. 18F is a second Smith chart describing the effect of a matching circuit.
Figure 18G:
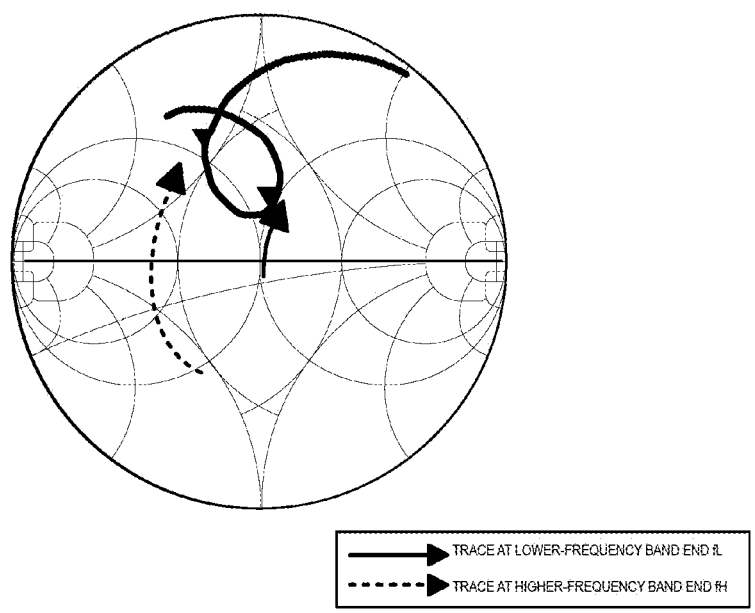
FIG. 18G is a third Smith chart describing the effect of a matching circuit.
Figure 18H:
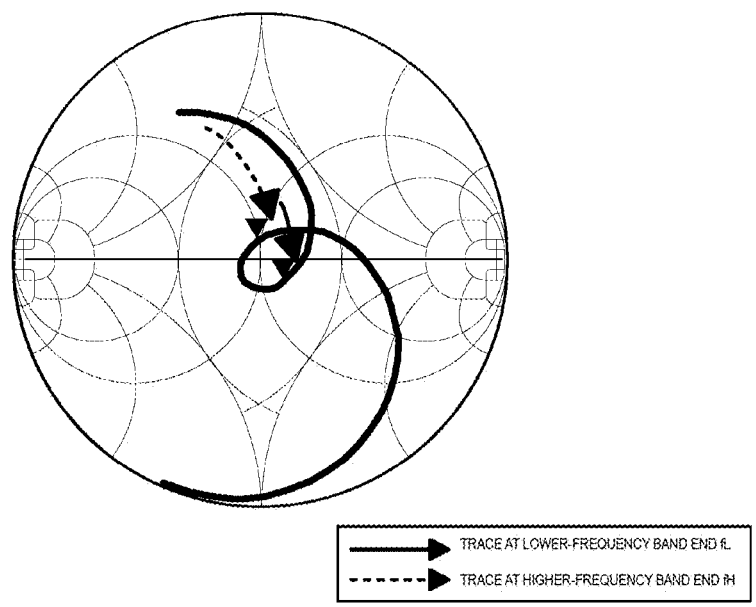
FIG. 18H is a fourth Smith chart describing the effect of a matching circuit.

As illustrated in FIGS. 18E and 18H, the amount of shift in the 18E is larger than that in FIG. 18H. Accordingly, the capacitance value C4 of the capacitor C may be smaller than or equal to the stray capacitance Cp1 of the switch device 10 to make it more possible to suppress an impedance mismatch.

As described above, the matching circuit 100 is further provided in the second embodiment in addition to the configuration according to the first embodiment to suppress an impedance mismatch. As a result, an insertion loss can be further reduced as described above. That is, as a method of reducing an insertion loss, the configuration including a cascade connection and a matching circuit is employed. Accordingly, an insertion loss may be reduced with the configuration that does not include a cascade connection and includes a matching circuit. Specifically, for example, the configuration may be employed which includes the matching circuit 100 illustrated in FIG. 16 in the radio-frequency front-end circuit 2000 according to the first comparative example illustrated in FIG. 4. Also in this case, an insertion loss can be reduced.

Other Modifications

The description of a front-end circuit according to an embodiment of the present disclosure has been made with the first and second embodiments, but the present disclosure is not limited to the above embodiments. The present disclosure also includes other embodiments realized by combining optional constituent elements in the above-described embodiments and modifications obtained by making various changes, which are conceived by those skilled in the art, to the above-described embodiments without departing from the spirit and scope of the present disclosure.

For example, in each of the switch circuits 1 and 3, not only a first switch element disposed on the path connecting the common terminal of the switch circuit and a selected terminal but also a second switch element disposed on the path connecting the path and the ground are provided as described above, but the second switch element does not necessarily have to be disposed.

For example, the first switch element and the second switch element do not necessarily have to exclusively operate. For example, when a switch device does not operate, both the first switch element and the second switch element may be brought into the conduction state for ESD protection.

For example, the number of stacks of semiconductor elements in the first switch element in the switch circuit 1 may differ from the number of stacks of semiconductor elements in the first switch element in the switch circuit 3. For example, when a device connected to the switch circuit 1 supports PC2 and a device connected to the switch circuit 3 supports PC3, the number of stacks in the switch circuit 1 may be smaller than that in the switch circuit 3 to satisfy required transmission power.

For example, the number of stacks of semiconductor elements in the first switch element in the switch circuit 2 is not limited to one on condition that it is smaller than that in the first switch element in the switch circuit 1. For example, when a device connected to the switch circuit 2 via the switch circuit 3 supports PC2, the number of stacks of semiconductor elements in the first switch element in the switch circuit 2 may be two or more.

For example, the number of stacks of semiconductor elements in the first switch element in the switch circuit 1 may be larger than the sum of the number of stacks in the first switch element in the switch circuit 2 and the number of stacks of semiconductor elements in the first switch element in the switch circuit 3.

For example, when the first switch element in the switch circuit 3 is in the non-conduction state, the first switch element in the switch circuit 2 does not necessarily have to be in the non-conduction state. That is, when the first switch element in the switch circuit 3 is in the non-conduction state, the first switch element in the switch circuit 2 may be in the conduction state.

For example, the switch circuit 2 does not necessarily have to be an SPST-type switch. For example, the switch circuit 2 may be an SP2T or SP3T-type switch.

REFERENCE SIGNS LIST 1, 1B, 2, 2A, and 3 switch circuit
1a, 1b, 3a, and 3b path
5, 5B, 5D, 200, and 2000 radio-frequency front-end circuit
10, 10A, 10B, 10D, and 1000 switch device
21, 21B, 22, and 31B multiplexer
31, 32, 211, 212, 213, 214, 221, and 222 filter
100 matching circuit
B1, B3, B32, B34, B39, B40, B41, and B7 communication band
C2 off capacitance
C4 capacitance value
Cp1 stray capacitance
E111, E112, E112B, E121, E121A, E131, E132, E200, E211, E212, E212B, E222A, E231, and E232 switch element
L1 and L2 inductor
Pan common terminal
Pb1, Pb1B, Pb2, Pb3, Pb4, Pb5, Pb5B, Pb5C, Pb6, Pb7, Pb8, Pc21, Pc22, Pc31, Pc31B, Pc32, Ps10, Ps101, Ps102, Ps102B, Ps20, Ps201, Ps30, Ps301, and Ps302 terminal
Pe external terminal
Q11, Q21, Q31, Qs1, Qs11, Qs2, Qs21, Qs3, Qs31, Qs4, Qs5, Qs6, Qs7, and Qs8 FET
Vc1a, Vc1b, Vc2, Vc3a, and Vc3b control terminal
W1 finger width
n the number of stacks

The invention claimed is:

1. A switch device comprising:
a common terminal;
a first switch circuit that includes a first terminal and a second terminal and is configured to switch between conduction and non-conduction between the first terminal and the second terminal;
a second switch circuit that includes a third terminal and a fourth terminal and is configured to switch between conduction and non-conduction between the third terminal and the fourth terminal; and
a third switch circuit that includes a fifth terminal and a plurality of sixth terminals and is configured to switch between conduction and non-conduction between the fifth terminal and at least one of the plurality of sixth terminals,
wherein the first terminal and the third terminal are connected to the common terminal,
wherein the fifth terminal is connected to the fourth terminal,
wherein the first switch circuit, the second switch circuit, and the third switch circuit include respective first switch elements disposed on a first path connecting the first terminal and the second terminal, a second path connecting the third terminal and the fourth terminal, and a plurality of third paths each connecting the fifth terminal and corresponding one of the plurality of sixth terminals, respectively,
wherein the first switch element includes one or more stacked semiconductor elements, and
wherein a number of stacks of the one or more semiconductor elements in the first switch element in the second switch circuit is smaller than a number of stacks of the one or more semiconductor elements in the first switch element in the first switch circuit,
wherein the first switch circuit and the third switch circuit further include respective second switch elements disposed on a path connecting the first path and a ground and paths each connecting corresponding one of the plurality of third paths and the ground, respectively,
wherein the second switch element in the first switch circuit is disposed between the first switch element in the first switch circuit and the second terminal,
wherein the second switch element in the third switch circuit is disposed between the first switch element in the third switch circuit and corresponding one of the plurality of sixth terminals, and
wherein the first switch element and the second switch element exclusively operate, and
wherein the number of stacks of the one or more semiconductor elements in the first switch element in the first switch circuit and a number of stacks of the one or more semiconductor elements in the second switch element in the first switch circuit are equal, and a number of stacks of the one or more semiconductor elements in the first switch element in the third switch circuit and a number of stacks of the one or more semiconductor elements in the second switch element in the third switch circuit are equal.

2. The switch device according to claim 1, wherein the number of stacks of the one or more semiconductor elements in the first switch element in the first switch circuit is equal to the number of stacks of the one or more semiconductor elements in the first switch element in the third switch circuit.

3. The switch device according to claim 1, wherein the number of stacks of the one or more semiconductor elements in the first switch element in the second switch circuit is smaller than the number of stacks of the one or more semiconductor elements in the first switch element in the third switch circuit.

4. The switch device according to claim 3, wherein the number of stacks of the one or more semiconductor elements in the first switch element in the first switch circuit is equal to the number of stacks of the one or more semiconductor elements in the first switch element in the third switch circuit.

5. The switch device according to claim 4, wherein the number of stacks of the one or more semiconductor elements in the first switch element in the second switch circuit is one.

6. The switch device according to claim 5, wherein the number of stacks of the one or more semiconductor elements in the first switch element in the first switch circuit is smaller than a sum of the number of stacks of the one or more semiconductor elements in the first switch element in the second switch circuit and the number of stacks of the one or more semiconductor elements in the first switch element in the third switch circuit.

7. The switch device according to claim 6, wherein, when there is no conduction between the third terminal and the fourth terminal in the second switch circuit, there is no conduction between the fifth terminal and the plurality of sixth terminals in the third switch circuit.

8. The switch device according to claim 7, wherein the first switch element is an FET switch.

9. The switch device according to claim 8, wherein a gate width of a semiconductor element in the first switch element in the second switch circuit is larger than at least one of that in the first switch element in the first switch circuit or that in the first switch element in the third switch circuit.

10. The switch device according to claim 9, wherein the second switch circuit is formed of only the first switch element.

11. The switch device according to claim 10, wherein the number of stacks of the one or more semiconductor elements in the first switch element in the first switch circuit and the number of stacks of the one or more semiconductor elements in the second switch element in the first switch circuit are equal, and the number of stacks of the one or more semiconductor elements in the first switch element in the third switch circuit and the number of stacks of the one or more semiconductor elements in the second switch element in the third switch circuit are equal.

12. The switch device according to claim 11, wherein the number of stacks of the one or more semiconductor elements in the first switch element in the first switch circuit and the number of stacks of the one or more semiconductor elements in the first switch element in the third switch circuit are greater than or equal to eight.

13. A front-end circuit comprising:
the switch device according to claim 12; and
a plurality of filters each connected to corresponding one of the second terminal and the plurality of sixth terminals.

14. The front-end circuit according to claim 13, wherein the plurality of filters include,
a first filter that has a first band as a passband and is connected to the second terminal, and
a second filter that has a second band as a passband and is connected to any one of the plurality of sixth terminals,
wherein the front-end circuit is configured to simultaneously transmit or receive a radio frequency signal in the first band and a radio frequency signal in the second band.

15. The front-end circuit according to claim 14, wherein the first band corresponds to PC2 (Power Class 2).

16. The front-end circuit according to claim 14, wherein the second band corresponds to PC3 (Power Class 3).

17. The front-end circuit according to claim 16, further comprising:
an external terminal; and
a matching circuit disposed between the common terminal and the external terminal,
wherein the matching circuit includes,
a first inductor disposed on a path connecting the common terminal and the external terminal,
a second inductor disposed on a path connecting a ground and a path connecting the common terminal and the first inductor, and
a capacitor disposed on a path connecting the ground and a path connecting the external terminal and the first inductor.

18. A front-end circuit comprising:
a switch device comprising:
a common terminal;
a first switch circuit that includes a first terminal and a second terminal and is configured to switch between conduction and non-conduction between the first terminal and the second terminal;
a second switch circuit that includes a third terminal and a fourth terminal and is configured to switch between conduction and non-conduction between the third terminal and the fourth terminal; and
a third switch circuit that includes a fifth terminal and a plurality of sixth terminals and is configured to switch between conduction and non-conduction between the fifth terminal and at least one of the plurality of sixth terminals,
wherein the first terminal and the third terminal are connected to the common terminal,
wherein the fifth terminal is connected to the fourth terminal,
wherein the first switch circuit, the second switch circuit, and the third switch circuit include respective first switch elements disposed on a first path connecting the first terminal and the second terminal, a second path connecting the third terminal and the fourth terminal, and a plurality of third paths each connecting the fifth terminal and corresponding one of the plurality of sixth terminals, respectively,
wherein the first switch element includes one or more stacked semiconductor elements, and wherein a number of stacks of the one or more semiconductor elements in the first switch element in the second switch circuit is smaller than a number of stacks of the one or more semiconductor elements in the first switch element in the first switch circuit, wherein the front end circuit further comprises:

a plurality of filters each connected to corresponding one of the second terminal and the plurality of sixth terminals;

an external terminal; and a matching circuit disposed between the common terminal and the external terminal, wherein the matching circuit includes, a first inductor disposed on a path connecting the common terminal and the external terminal, a second inductor disposed on a path connecting a ground and a path connecting the common terminal and the first inductor, and a capacitor disposed on a path connecting the ground and a path connecting the external terminal and the first inductor, wherein, when a stray capacitance of the first switch circuit is represented by C1, an off capacitance of the first switch element in the second switch circuit is represented by C2, and a stray capacitance of the third switch circuit is represented by C3, a capacitance C4 of the capacitor satisfies Expression (1) when the second switch circuit is in a non-conduction state and Expression (2) when the second switch circuit is in the conduction state

[Expression 1]

$$(C1 \cdot C2)/(C1+C2)+C3 \geq C4 \qquad (1)$$

[Expression 2]

$$C1+C3 \geq C4 \qquad (2).$$

19. The front-end circuit according to claim 18, wherein an inductance value of the first inductor is bigger than that of the second inductor.

20. The front-end circuit according to claim 17, wherein an inductance value of the first inductor is bigger than that of the second inductor.

* * * * *